(12) United States Patent
Hong et al.

(10) Patent No.: US 12,279,508 B2
(45) Date of Patent: *Apr. 15, 2025

(54) DISPLAY DEVICE

(71) Applicant: SAMSUNG DISPLAY CO., LTD., Yongin-si (KR)

(72) Inventors: Sung Jin Hong, Yongin-si (KR); Gun Shik Kim, Yongin-si (KR); Tae Hoon Yang, Yongin-si (KR); Ja Eun Lee, Yongin-si (KR); Sun Ho Kim, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 0 days.

This patent is subject to a terminal disclaimer.

(21) Appl. No.: 18/231,008

(22) Filed: Aug. 7, 2023

(65) Prior Publication Data

US 2023/0397471 A1 Dec. 7, 2023

Related U.S. Application Data

(63) Continuation of application No. 17/159,416, filed on Jan. 27, 2021, now Pat. No. 11,723,255.

(30) Foreign Application Priority Data

Apr. 22, 2020 (KR) ........................ 10-2020-0048902

(51) Int. Cl.
*G09G 5/00* (2006.01)
*H10K 50/86* (2023.01)
(Continued)

(52) U.S. Cl.
CPC ........... *H10K 59/65* (2023.02); *H10K 50/865* (2023.02); *H10K 59/1213* (2023.02)

(58) Field of Classification Search
CPC .. H10K 59/65; H10K 59/1213; H10K 50/865; H01L 27/323; G06F 3/0412; G06F 3/0448; G06F 3/0446; G06F 3/14
(Continued)

(56) References Cited

U.S. PATENT DOCUMENTS 9,559,124 B2 1/2017 Park et al.
10,756,136 B1 8/2020 Ma et al.
(Continued)

FOREIGN PATENT DOCUMENTS

| KR | 1020150077552 A | 7/2015 |
| KR | 1020170113066 A | 10/2017 |
| KR | 1020190028245 A | 3/2019 |

*Primary Examiner* — Jennifer T Nguyen
(74) *Attorney, Agent, or Firm* — CANTOR COLBURN LLP

(57) ABSTRACT

A display device includes: a display panel including a substrate, where the display panel is divided into a first display region in which a plurality of first pixels is disposed and a second display region in which a plurality of second pixels is disposed; and a sensor overlapping the second display region of the display panel. The second display region includes a plurality of unit pixel blocks, each including two second pixels adjacent to each other in a first direction and two second pixels adjacent to each other in a second direction intersecting the first direction, and a transmissive region through which light is transmitted. A distance between two unit pixel blocks adjacent to each other in the first direction is greater than a distance between two unit pixel blocks adjacent to each other in an oblique direction inclined to the first direction.

20 Claims, 28 Drawing Sheets

(51) Int. Cl.
*H10K 59/121* (2023.01)
*H10K 59/65* (2023.01)

(58) Field of Classification Search
USPC .......................................................... 345/156
See application file for complete search history.

(56) References Cited

U.S. PATENT DOCUMENTS

| | | | |
|---|---|---|---|
| 11,723,255 B2* | 8/2023 | Hong | H10K 59/352 |
| | | | 345/156 |
| 2010/0289994 A1* | 11/2010 | Nonaka | G09G 3/20 |
| | | | 349/108 |
| 2011/0204369 A1 | 8/2011 | Ha et al. | |
| 2011/0220901 A1 | 9/2011 | Ha et al. | |
| 2018/0145118 A1* | 5/2018 | Kim | H10K 59/121 |
| 2019/0130822 A1 | 5/2019 | Jung et al. | |
| 2020/0066809 A1 | 2/2020 | Liu | |
| 2021/0065625 A1 | 3/2021 | Wang et al. | |
| 2021/0159286 A1* | 5/2021 | Ma | H10K 59/126 |
| 2021/0191548 A1* | 6/2021 | Huang | G06F 3/0412 |
| 2021/0258379 A1 | 8/2021 | Liu et al. | |
| 2021/0384269 A1* | 12/2021 | Zhou | H10K 59/352 |
| 2021/0384275 A1* | 12/2021 | Wang | H10K 59/131 |
| 2021/0408161 A1* | 12/2021 | Sui | H10K 59/352 |

* cited by examiner

DISPLAY DEVICE

This application is a continuation of U.S. patent application Ser. No. 17/159,416, filed on Jan. 27, 2021, which claims priority to Korean patent application 10-2020-0048902, filed on Apr. 22, 2020, and all the benefits accruing therefrom under 35 U.S.C. § 119, the content of which in its entirety is herein incorporated by reference.

BACKGROUND

1. Field

The disclosure generally relates to a display device.

2. Description of the Related Art

A display device such as a general smartphone may include at least one display portion. The display portion is a data output portion, and input data may be displayed on the display portion. Also, the display portion may include a touch sensor, to be operated as a touch screen. The display portion may be defined at a front surface of the display device, to display various types of information.

Recently, in a display device such as a mobile terminal, a display portion has occupied substantially an entire portion of a front surface of the display device, and therefore, a camera, a proximity sensor, a fingerprint recognition sensor, an illuminance sensor, a near-infrared sensor, and the like may be disposed while overlapping with at least one region of the display portion.

SUMMARY

Embodiments provide a display device with improved quality of an image.

In accordance with an embodiment of the disclosure, a display device includes: a display panel including a substrate, where the display panel is divided into a first display region in which a plurality of first pixels is disposed and a second display region in which a plurality of second pixels is disposed; and a sensor overlapping the second display region of the display panel. In such an embodiment, the second display region includes a plurality of unit pixel blocks, each including two by two second pixels adjacent to each other in a first direction and in a second direction intersecting the first direction, and a transmissive region through which light is transmitted. In such an embodiment, in a plan view, a distance between two unit pixel blocks adjacent to each other in the first direction is greater than a distance between two unit pixel blocks adjacent to each other in an oblique direction inclined to the first direction.

In an embodiment, when the distance between the two unit pixel blocks adjacent to each other in the first direction is a, the distance between the two unit pixel blocks adjacent to each other in the oblique direction may be $\sqrt{2}a/2$.

In an embodiment, the distance between the two unit pixel blocks adjacent to each other in the first direction may be equal to the distance between two unit pixel blocks adjacent to each other in the second direction.

In an embodiment, the second pixels may not be disposed in the transmissive region, and the transmissive region may be disposed between the two unit pixel blocks adjacent to each other in the first direction, between two unit pixel blocks adjacent to each other in the second direction, and between two unit pixel blocks adjacent to each other in the oblique direction.

In an embodiment, in at least one region of the second display region, a ratio of areas occupied by a region of the second pixels and the transmissive region may be about 2:9.

In an embodiment, a density of the first pixels in the first display region may be higher than a density of the second pixels in the second display region.

In an embodiment, the second display region may have a size smaller than a size of the first display region, and be connected to the first display region.

In an embodiment, the display device may further include a line part including a conductive line connecting the two unit pixel blocks adjacent to each other in the oblique direction. In such an embodiment, the line part may extend along the oblique direction.

In an embodiment, the transmissive region may include a unit transmissive block surrounded by the two unit pixel blocks adjacent to each other in the first direction, the two unit pixel blocks adjacent to each other in the second direction, and the line part.

In an embodiment, the unit transmissive block may substantially have a circular shape.

In an embodiment, the line part may not overlap the unit transmissive block.

In an embodiment, the display device may further include a light blocking pattern disposed between the substrate and the line part.

In an embodiment, the light blocking pattern may include an opaque conductive material.

In an embodiment, the light blocking pattern may be electrically connected to the line part.

In an embodiment, each of the second pixels may include a pixel circuit which is disposed on the substrate and includes a transistor. In such an embodiment, the light blocking pattern may be disposed between the substrate and the pixel circuit.

In an embodiment, the transmissive region may include an insulating layer which is disposed on the substrate, and an opening may be defined through the insulating layer.

In an embodiment, the second display region may be disposed to overlap at least a portion of the sensor to allow light to pass therethrough to the sensor.

In an embodiment, the sensor may include at least one selected from a camera, a proximity sensor, an illuminance sensor, a gesture sensor, a motion sensor, a fingerprint recognition sensor and a biometric sensor, or a combination thereof.

In an embodiment, the first display region may include a first pixel region in which each of the first pixels is disposed, and the second display region includes a second pixel region in which each of the second pixels is disposed. In such an embodiment, the first pixel region and the second pixel region may have a same size as each other.

In accordance with another embodiment of the disclosure, a display device includes: a sensor which senses incident light; and a display panel overlapping the sensor, where the display panel displays an image, and the display panel is divided into a first display region, a second display region having a light transmittance higher than a light transmittance of the first display region, and a non-display region surrounding a periphery of the first and second display regions. In such an embodiment, the display panel includes: a substrate; a plurality of first pixels disposed on the substrate in the first display region; and a plurality of second pixels disposed on the substrate in the second display region. In such an embodiment, the second display region includes a plurality of unit pixel blocks, each including two by two second pixels adjacent to each other in a first direction and in a second direction intersecting the first direction, a transmissive region through which light is transmitted, and a line part including a conductive line connecting two unit pixel blocks adjacent to each other in an oblique direction inclined to the first direction. In such an embodiment, the transmissive region includes a unit transmissive block having a circular shape and surrounded by two unit pixel blocks adjacent to each other in the first direction, two unit pixel blocks adjacent to each other in the second direction, and the line part. In such an embodiment, in a plan view, a distance between the two unit pixel blocks adjacent to each other in the first direction is greater than a distance between the two unit pixel blocks adjacent to each other in the oblique direction.

BRIEF DESCRIPTION OF THE DRAWINGS

The above and other features of the invention will become more apparent by describing in further detail embodiments thereof with reference to the accompanying drawings, in which.

DETAILED DESCRIPTION

Figure 1A:
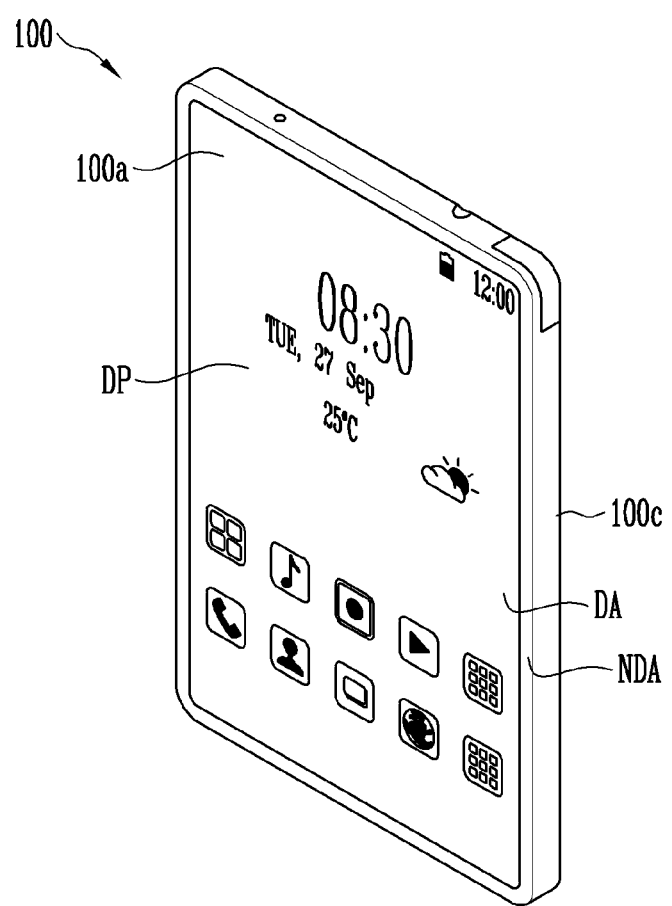
FIG. 1A is a perspective view briefly illustrating a front surface of a display device in accordance with an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the disclosure will be described in detail with reference to the accompanying drawings.

Figure 1B:
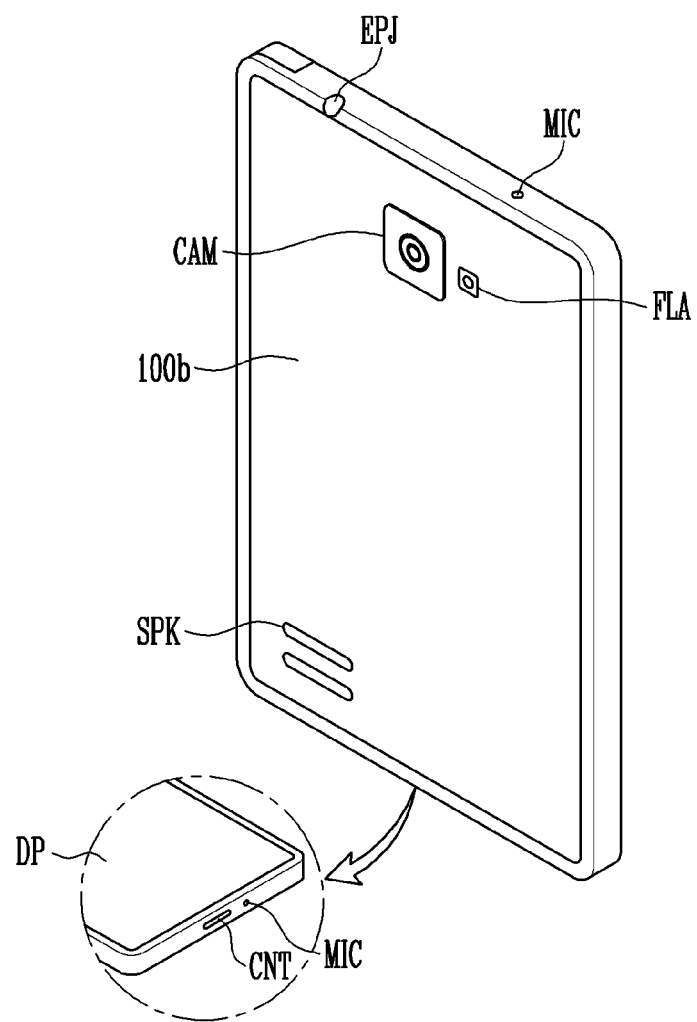
FIG. 1B is perspective views briefly illustrating a rear surface and a bottom surface of the display device shown in FIG. 1A.

FIG. 1A is a perspective view briefly illustrating a front surface of a display device in accordance with an embodiment of the disclosure. FIG. 1B is perspective views briefly illustrating a rear surface and a bottom surface of the display device shown in FIG. 1A.

For convenience of illustration and description, an embodiment in which a main home screen is displayed on a display panel DP of the display device 100 is illustrated in FIG. 1A.

Referring to FIGS. 1A and 1B, in an embodiment, the display panel DP may define a front surface 100a of the display device 100. The front surface 100a of the display device 100 may include a display region DA in which the display panel DP is disposed to display various data and a non-display region NDA provided at at least one side of the display region DA.

In an embodiment, as shown in FIG. 1B, a rear camera CAM, a flash FLA, a speaker SPK, or the like may be located at a rear surface 100b of the display device 100. In one embodiment, for example, a power/reset button, a volume button, a terrestrial digital multimedia broadcasting ("DMB") antenna for broadcasting reception, one or a plurality of microphones MIC, or the like may be located at a side surface 100c of the display device 100. In an embodiment, a connector CNT may be provided at a bottom surface or a lower end side surface of the display device 100. The connector CNT includes or is formed with a plurality of electrodes, and be connected to an external device by wire. An earphone connection jack EPJ may be disposed at an upper end side surface of the display device 100.

In an embodiment of the display device 100, a component such as a sensor, for example, is disposed at a lower portion of the inside of the display panel DP, such that the aesthetic appearance of the front surface 100a of the display device 100 may be improve, and the display region DA may be increased. The component may be an optical component associated with light. In an embodiment, the component may be an optical component into which external light is incident or an optical component when emits light. The optical component may include, for example, a fingerprint scanner, an image capturing device, a strobe, a photo sensor, a proximity sensor, an indicator, a solar panel, or the like.

In an embodiment, the display panel DP may be disposed to occupy a substantially entire portion of the front surface 100a of the display device 100. In such an embodiment where the display panel DP is entirely disposed at the front surface 100a of the display device 100, the display device 100 may be substantially referred to as a "full front display." In the "full front display," a substantially entire portion of the front surface 100a of the display device 100 may be defined by the display region DA.

In an embodiment, the display panel DP may be an organic light emitting display panel. In such an embodiment, the display device 100 including the display panel DP may be an organic light emitting display device. In an embodiment, the display panel DP may include or function as a touch screen including touch electrodes.

In an embodiment, as shown in FIG. 1A, a main home screen may be displayed on the display panel DP. The main home screen may be a first screen displayed on the display panel DP, when the power of the display device 100 is turned on. States of the display device 100, such as a battery charging state, the intensity of a received signal, and a current time, may be displayed at an upper end of the display panel DP. The display panel DP may display various contents or information (e.g., texts, images, videos, icons, and/or symbols) to a user.

Figure 2A:
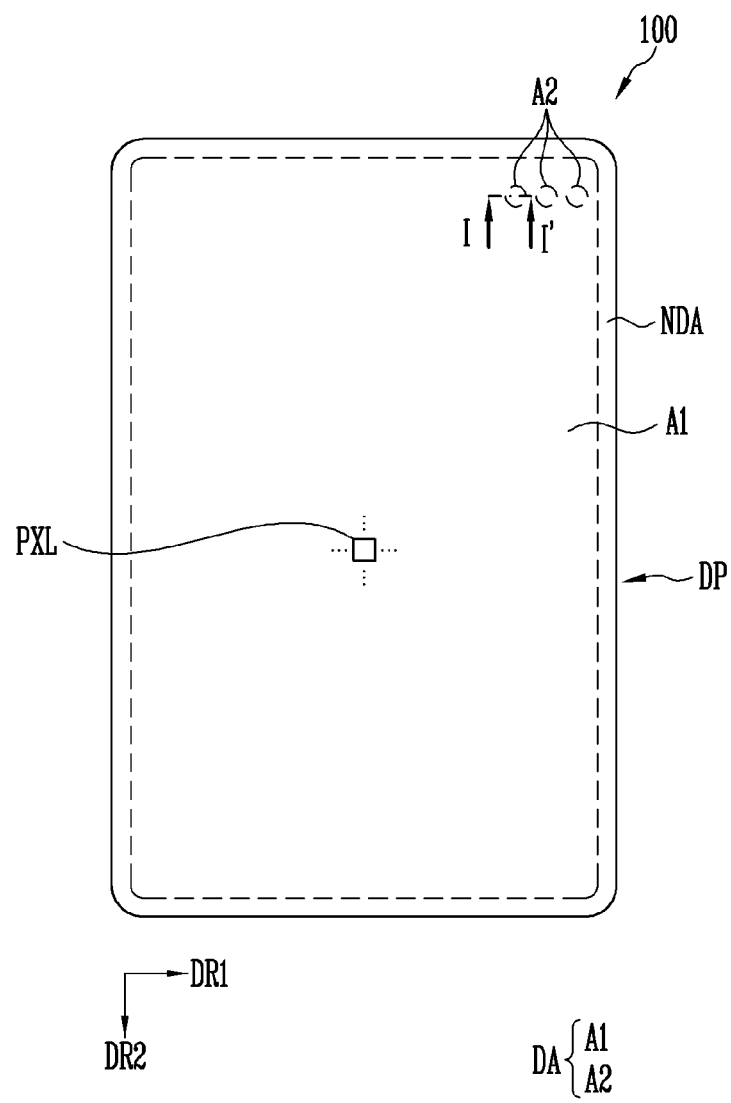
FIGS. 2A to 2C are plan views briefly illustrating a display device in accordance with an embodiment of the disclosure.
Figure 2B:
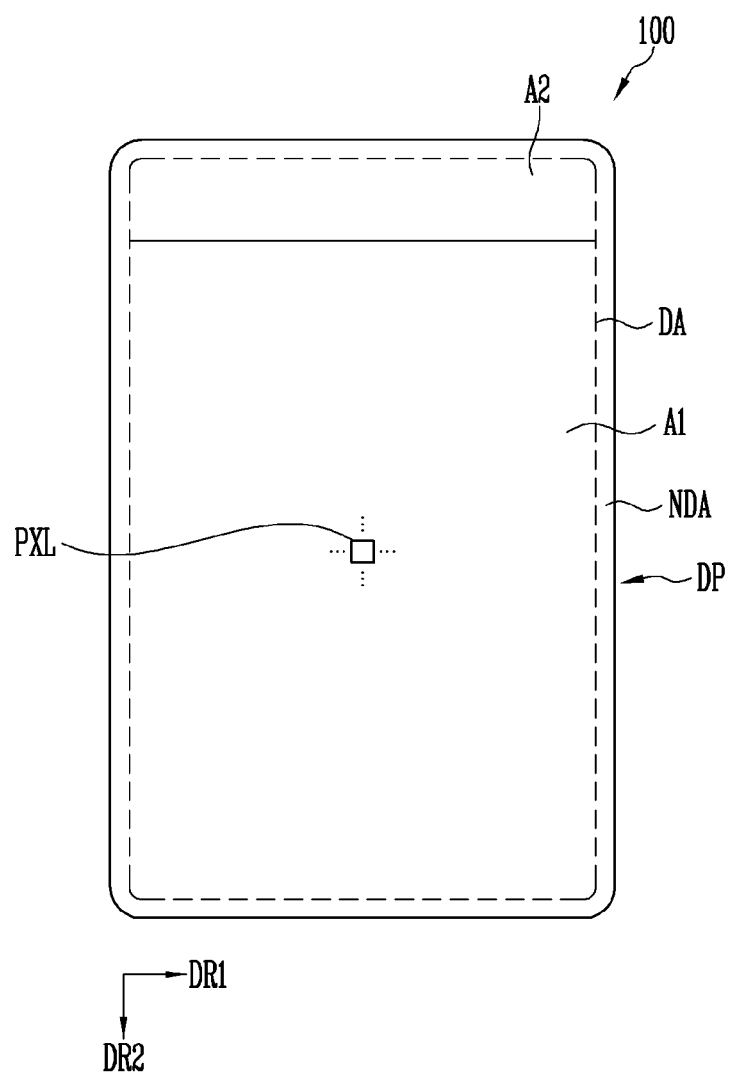
Figure 2C:
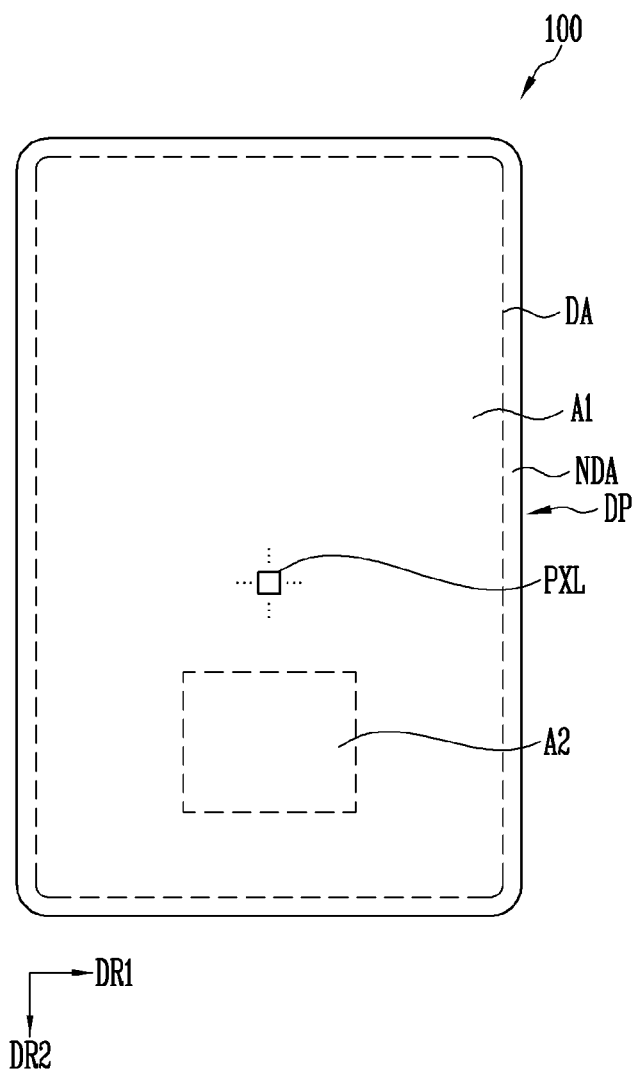
Figure 3:
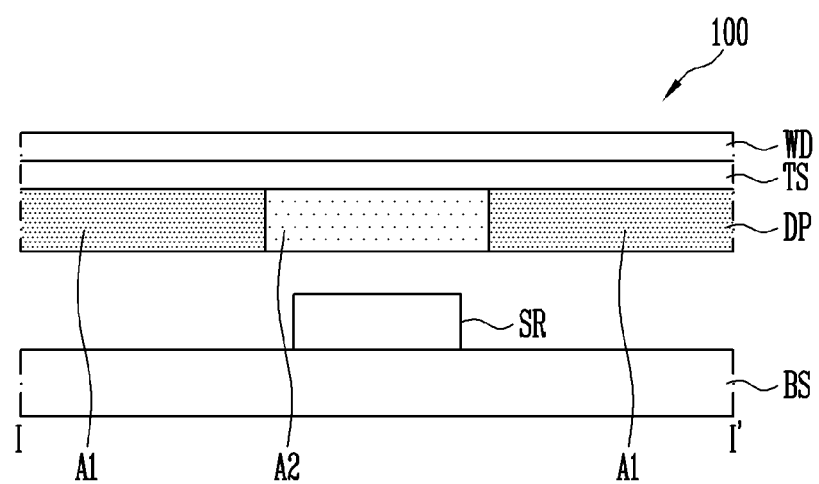
FIG. 3 is a sectional view taken along line I-I' shown in FIG. 2A.

FIGS. 2A to 2C are plan views briefly illustrating a display device in accordance with an embodiment of the disclosure. FIG. 3 is a sectional view taken along line I-I' shown in FIG. 2A.

Referring to FIGS. 1A to 3, the whole or at least a portion of the display device 100 may be flexible or have flexibility. In an embodiment, the display device 100 may have flexibility in the entire region or have flexibility in a region corresponding to a flexible region. In an embodiment where the whole of the display device 100 has flexibility, the display device 100 may be a rollable display device. In an embodiment where a portion of the display device 100 has flexibility, the display device 100 may be a foldable display device, but the disclosure is not limited thereto.

In an embodiment of the disclosure, as shown in FIGS. 2A to 3, the display device 100 may include a display panel DP, a touch sensor TS, a window WD, and at least one sensor SR.

The display panel DP may be disposed at a front surface of the display device 100.

The display panel DP displays various visual information, e.g., a text, a video, a picture, a two-dimensional or three-dimensional image, or the like, on a front surface (e.g., an image display surface). The type of the display panel DP is not particularly limited. In an embodiment, the display panel DP may be a self-luminescent display panel such as an organic light emitting display ("OLED") panel. Alternatively, the display panel DP may be a non-self-luminescent display panel such as a liquid crystal display ("LCD") panel, an electro-phoretic display ("EPD") panel, or an electro-wetting display ("EWD") panel. In such an embodiment where the non-self-luminescent display panel is used as the display panel DP of the display device 100, the display device 100 may further include a backlight unit which supplies light to the display panel DP. Hereinafter, for convenience of description, embodiments where the display panel DP is an OLED panel will be described in detail. However, the types of the display panel DP is not limited thereto, and another type of display panel may be used as the display panel DP without departing from the teaching herein. In an embodiment of the disclosure, the display panel DP may have the same configuration as the display panel DP included in the display device 100 shown in FIG. 1A.

The display panel DP may include a display region DA and a non-display region NDA surrounding at least one side of the display region DA.

A plurality of pixels PXL may be disposed or provided in the display region DA. In an embodiment, each of the pixels PXL may include at least one light emitting device. In an embodiment, the light emitting device may be a light emitting unit including an organic light emitting diode or sub-miniature inorganic light emitting diodes having a size in a micro or nano scale range, but the disclosure is not limited thereto. The display panel DP may drive the pixels PXL, based on input image data, to display an image in the display region DA. The display region DA may occupy substantially the entire portion of the front surface of the display device 100.

The non-display region NDA is a region surrounding at least one side of the display region DA, and may be the remaining region except the display region DA. In an embodiment, the non-display region NDA may include a line region, a pad region, and/or various dummy regions.

In an embodiment of the disclosure, the display region DA may be defined by substantially the entire of the front surface of the display device 100 as shown in FIGS. 2A to 2C. In such an embodiment where the display region DA is defined by substantially the entire of the front surface, the non-display region NDA is not disposed at the front surface or may be disposed in a very narrow area at the front surface. In an embodiment, the display region DA may be in contact with a side edge of the display device 100 or be disposed at a predetermined distance from the side edge. FIGS. 2A to 2C illustrate an embodiment where the display region DA is disposed at only the front surface of the electronic device 400, but the disclosure is not limited thereto. In an alternative embodiment, the display region DA may be disposed in at least one region of the side edge of the display device 100, at least one region of a rear surface, or the like. Display regions DA disposed at a plurality of surfaces of the display device 100 may be connected to each other at least partially or be separated or spaced apart from each other.

In an embodiment of the disclosure, the display device 100 may include at least one sensor SR disposed to overlap at least a portion of the display region DA. The sensor SR may be disposed below pixels PXL and/or lines, which are disposed in the display region DA, such that the sensor SR may not be seen by a user through the front surface of the display device 100. In such an embodiment where the sensor is disposed below the display region DA to overlap the display region DA, the aesthetic appearance of the display device 100, particularly, the aesthetic appearance of the front surface corresponding to the display region DA may be improved, and the display region DA may be more widely secured.

In an embodiment of the disclosure, as shown in FIG. 2B, the display region DA may be divided into a first display region A1 and a second display region A2. In such an embodiment, the sensor SR may not overlap the first display region A1, and the sensor SR may overlap the second display region A2. In an embodiment, the first display region A1 may be set to have a size (or area) greater than that of the second display region A2.

The second display region A2 may be located in the display region DA and be surrounded by the first display region A1 as shown in FIGS. 2A and 2C. In an embodiment, as shown in FIG. 2A, the second display region A2 may have an approximately circular shape, but the disclosure is not limited thereto. In an alternative embodiment, the second display region A2 may have a polygonal shape including a quadrangular shape as shown in FIG. 2C, or have one of other various shapes including an elliptical shape.

The display region DA may include a first display region A1 and a second display region A2, which are arrange along one direction, e.g., a second direction DR2 as shown in FIG. 2B. The first display region A1 and the second display region A2 may be connected or adjacent to each other. In an embodiment, the second display region A2 may be provided (or set) to have a region wider than that overlapping with the sensor SR. In one embodiment, for example, the second display region A2 may be widely formed at one end (e.g., an upper end portion) of the display device 100 as shown in FIG. 2B. In an embodiment, as shown in FIG. 2B, at least one second display region A2 is disposed at only a front upper end portion of the display device 100, but the disclosure is not limited thereto. In an alternative embodiment, only a single second display region A2 may be provided in the display region DA or the second display region A2 may be provided in plural. In an embodiment where the second display region A2 is provided in plural, the second display regions A2 may be disposed adjacent to each other or be variously disposed within the display region DA. In an embodiment where the display region DA is formed at a side edge and/or a rear surface of the display device 100, a portion of the second display region A2 may be formed in the display region DA at the side edge and/or the rear surface of the display device 100.

In an embodiment, the sensor SR, which is disposed to overlap the second display region A2, may be an optical component. In such an embodiment, the sensor SR may be a component which receives light or emits light. The sensor SR may include, for example, a fingerprint scanner, an image capturing device, a strobe, a photo sensor, a proximity sensor, an indicator, a solar panel, or the like. However, the sensor SR is not limited to the optical component, and may include various components such as an ultrasonic sensor, a microphone, an environment sensor (e.g., a barometer, a hygrometer, a thermometer, a radiation detection sensor, a thermal sensor, etc.), and a chemical sensor (e.g., a gas sensor, a dust sensor, an odor sensor, etc.). In an embodiment of the disclosure, the sensor SR may include a plurality of sensors overlapping the second display region A2. The plurality of sensors may include a camera, a proximity sensor, and an illuminance sensor, which are disposed in a line.

In such an embodiment, the sensor SR may be disposed on a separate base substrate BS including or made of a plastic or metallic material, such as a bracket or a case, which is not shown, by using a surface mount device ("SMD") method to face (or correspond to) at least one region, e.g., the second display region A2 of the display region DA.

The second display region A2 may allow a signal (e.g., light or beam) input to the sensor SR to be transmitted therethrough. The second display region A2 may have a transmittance higher than that of the first display region A1 to improve the transmittance of the signal. Each of the transmittance of the second display region A2 and the transmittance of the first display region A1 may be a degree to which light is transmitted per unit area (, a predetermined area, or the same area). For example, the transmittance may be a ratio of light incident into a unit area of the display panel DP to light transmitted through the display panel DP. Thus, the second display region A2 having a relatively high transmittance may enable a signal (e.g., light or beam) to be effectively transmitted therethrough, as compared with the first display region A1. In one embodiment, for example, as compared with the first display region A1, pixels PXL may be disposed at a low density in the second display region A2. A gap between the pixels PXL disposed at the low density forms a physical and/or optical opening, e.g., a transmission window, to enable a signal (e.g., light or beam) to be more effectively transmitted therethrough.

A plurality of pixels PXL may be disposed in the first display region A1 and the second display region A2. Each of the pixels PXL may include a light emitting device emitting light. In an embodiment, the light emitting device may be, for example, an organic light emitting diode, but the disclosure is not limited thereto. In an alternative embodiment, the light emitting device may be an inorganic light emitting device including an inorganic light emitting material or a light emitting device (quantum dot display element) for emitting light by changing the wavelength of light emitted using a quantum dot.

In an embodiment, the touch sensor TS and the window WD may be disposed on the display panel DP.

The touch sensor TS may include touch electrodes, and be disposed on the image display surface of the display panel DP to receive a touch input and/or a hovering input of a user. The touch sensor TS may recognize a touch input and/or a hovering input of the display device 100 by sensing a touch capacitance through contact and/or proximity of a separate input means such as a hand of a user or a conductor similar thereto. The touch input may mean that the display device 100 is directly touched (or in direct contact with) by the hand of the user or the separate input means, and the hovering input may mean that the hand of the user or the separate input means is in the vicinity of the display device 100 including the touch sensor TS but does not touch the display device 100.

In an embodiment, the touch sensor TS may sense a touch operation of the user, and move an object displayed in the display device 100 from an originally displayed position to another position in response to the touch operation. The touch operation may include at least one of a single touch, a multi-touch, and a touch gesture. In an embodiment, various touch operations may be performed, which include a specific gesture of enlarging or reducing a text or an image by moving a finger of the user at a certain distance in a state in which the finger of the user touches a touch surface of the touch sensor TS.

The window WD is a member or element disposed at an uppermost portion of the display device 100 including the display panel DP, and may include a transmissive substrate which is substantially transparent. The window WD reduces an external impact while allowing an image from the display panel DP to be transmitted therethrough, so that the display panel DP may be effectively prevented from being damaged or malfunctioning due to the external impact. The external impact is a force from the outside, which may be expressed as pressure, stress or the like, and may mean a force which may cause a defect of the display panel DP. The window WD may include a rigid or flexible substrate, and the material constituting the window WD is not particularly limited.

Figure 4:
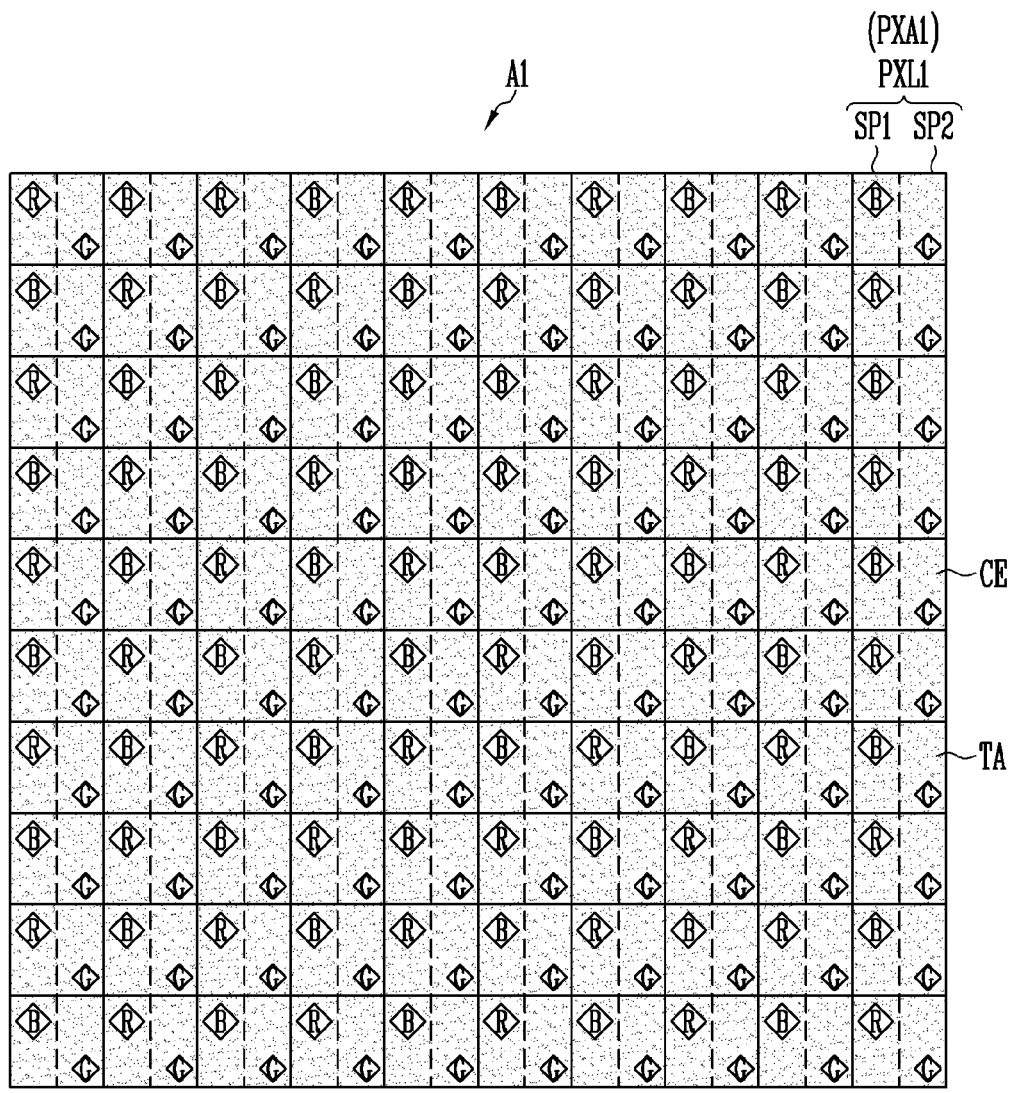
FIG. 4 is a plan view schematically illustrating a first display region in accordance with an embodiment of the disclosure.
Figure 5:
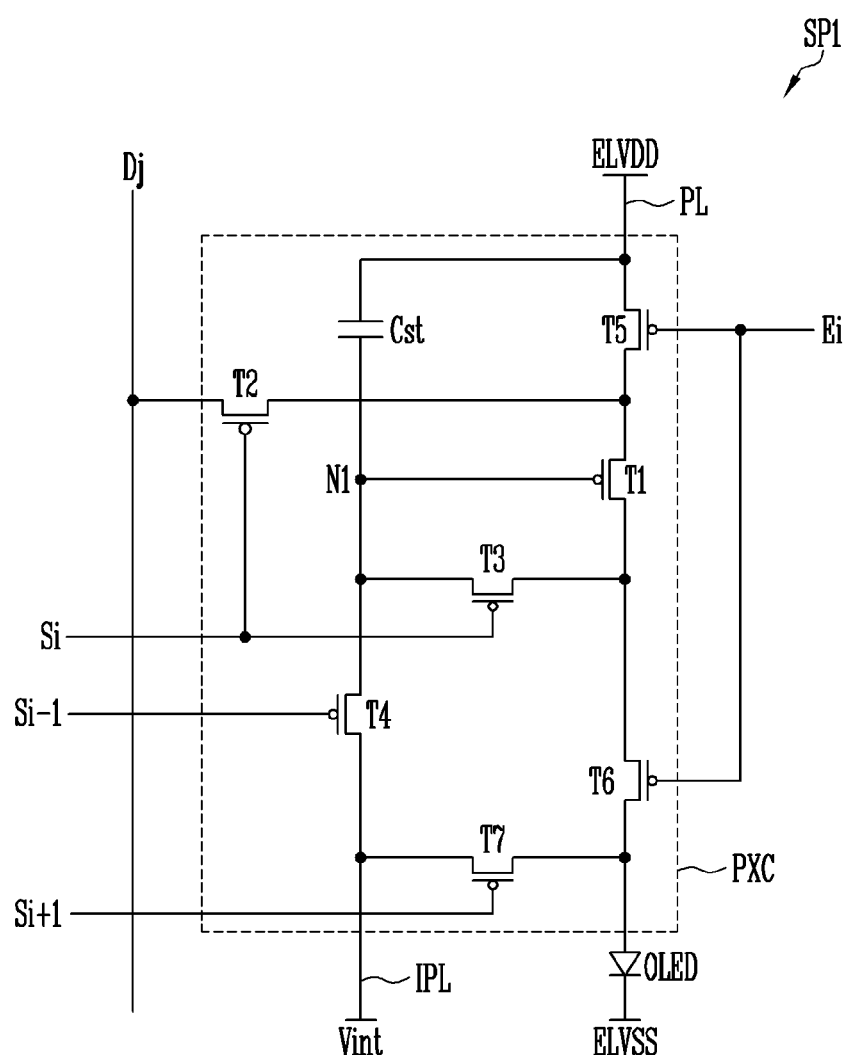
FIG. 5 is a circuit diagram illustrating an electrical connection relationship of components included in an embodiment of a first sub-pixel shown in FIG. 4.

FIG. 4 is a plan view schematically illustrating a first display region in accordance with an embodiment of the disclosure. FIG. 5 is a circuit diagram illustrating an electrical connection relationship of components included in an embodiment of a first sub-pixel shown in FIG. 4.

In FIG. 5, an active type sub-pixel, e.g., a first sub-pixel shown in FIG. 4, is illustrated, which is connected to an i-th scan line Si and an i-th emission control line Ei, which are disposed in an i-th horizontal sub-pixel column of the first display region A1, and a j-th data line Dj disposed in a j-th vertical sub-pixel column of the first display region A1, and includes seven transistors.

Referring to FIGS. 1A to 5, the first display region A1 is one region of the display region DA, and a plurality of first pixels PXL1 may be arranged in the first display region A1.

Each first pixel PXL1 may include at least one sub-pixel. In one embodiment, for example, the first pixel PXL1 may include two sub-pixels SP1 and SP2. A first sub-pixel SP1 may be a red pixel for emitting red light R or a blue pixel for emitting blue light B, and a second sub-pixel SP2 may be a green pixel for emitting green light G. However, the disclosure is not limited thereto. In an alternative embodiment, the first sub-pixel SP1 may be a green pixel for emitting green light G, and the second sub-pixel SP2 may be a red pixel for emitting red light R or a blue pixel for emitting blue light B.

In an embodiment, as shown in FIG. 4, first sub-pixels SP1 for emitting red light R and first sub-pixels SP1 for emitting blue light B may be alternately disposed in a second direction DR2, e.g., a vertical direction or column direction, to constitute a first sub-pixel column. In such an embodiment, in the first sub-pixel column, the first sub-pixels SP1 may be arranged in an order of a first sub-pixel SP1 for emitting red light R, a first sub-pixel SP1 for emitting blue light B, a first sub-pixel SP1 for emitting red light R, a first sub-pixel SP1 for emitting blue light B, a first sub-pixel SP1 for emitting red light R, . . . . In such an embodiment, second sub-pixels SP2 for emitting green light G may be arranged in the second direction DR2 to constitute a second sub-pixel column. In such an embodiment, in the second sub-pixel column, the second sub-pixels SP2 may be arranged in an order of a second sub-pixel SP2 for emitting green light G, a second sub-pixel SP2 for emitting green light G, a second sub-pixel SP2 for emitting green light G, . . . .

In an embodiment of the disclosure, sub-pixel arrangement orders in first sub-pixel columns may be different from each other. In an embodiment, in one of the first sub-pixel columns, the first sub-pixels SP1 may be arranged in an order of a first sub-pixel SP1 for emitting red light R, a first sub-pixel SP1 for emitting blue light B, a first sub-pixel SP1 for emitting red light R, a first sub-pixel SP1 for emitting blue light B, . . . . In another of the first sub-pixel columns, the first sub-pixels SP1 may be arranged in an order of a first sub-pixel SP1 for emitting blue light B, a first sub-pixel SP1 for emitting red light R, a first sub-pixel SP1 for emitting blue light B, a first sub-pixel SP1 for emitting red light R, . . . .

Each of the first sub-pixel column and the second sub-pixel column may be provided in plural, and the plurality of first sub-pixel columns and the plurality of second sub-pixel columns may be alternately arranged along a first direction DR1, e.g., a horizontal direction or row direction.

In the first display region A1, two first sub-pixels SP1 for emitting red light R and two first sub-pixels SP1 for emitting blue light B may be located in diagonal directions with respect to one second sub-pixel SP2 for emitting green light G. In an embodiment, with respect to one second sub-pixel SP2, two first sub-pixels SP1 for emitting blue light B may be disposed in a third direction DR3 (e.g., a direction inclined to the first direction DR1), and two first sub-pixels SP1 for emitting red light R may be disposed in a fourth direction DR4 (e.g., a direction inclined to the second direction DR2).

Two first sub-pixels SP1 for emitting red light R and two first sub-pixels SP1 for emitting blue light B may face each other with one second sub-pixel SP2 for emitting green light G as the center, which is interposed therebetween. Each of the first and second sub-pixels SP1 and SP2 may have a light emitting region having a rhombic structure, and the first and second sub-pixels SP1 and SP2 may have a same area or similar areas as each other. However, the disclosure is not limited thereto, and alternatively, the first and second sub-pixels SP1 and SP2 may have different structures from each other. The light emitting regions of some of the first and second sub-pixels SP1 and SP2 may have an area (or size) smaller or greater than that of the light emitting region of the other sub-pixels. For convenience of illustration and description, an embodiment where the light emitting region of the first sub-pixel SP1 and the light emitting region of the second sub-pixel SP2 have different areas (or sizes) is illustrated in FIG. 4.

In an embodiment of the disclosure, the first display region A1 may include a first pixel region PXA1 in which a corresponding first pixel PXL1 is disposed. In such an embodiment, a plurality of first pixel regions PXA1 may be arranged in the first display region A1. A predetermined number of first pixel regions PXA1 may be arranged along the first direction DR1 and the second direction DR2 based on a resolution of the display panel DP. Colored light and/or white light may be implemented by a combination of light emitted from the sub-pixels included in each first unit pixel region PXA1.

The first pixels PXL1, each including the first and second sub-pixels SP1 and SP2, may be disposed with a first density in the first display region A1. The first density may be, for example, a density at which the first pixels PXL1 are densely disposed in the first display region A1, so that the total area of the first display region A1 is substantially equal to an area in which the first pixels PXL1 are disposed. The first density may be defined as a total number of the first pixels PXL1 per a unit area of the first display region A1 (e.g., pixel per inch ("PPI")). Alternatively, the first density may be defined as a ratio (%) of an area in which the first pixels PXL1 are disposed to a total area of the first display region A1.

Each of the first and second sub-pixels SP1 and SP2 may include a light emitting device which emits light and a pixel circuit including at least one transistor for driving the light emitting device. The pixel circuits of the first and second sub-pixels SP1 and SP2 may have substantially similar structures or the same structure as each other. Accordingly, for convenience of description, a pixel circuit PXC of the first sub-pixel SP1 will hereinafter be described in detail with reference to FIG. 5, and any repetitive detailed description of the pixel circuit of the second sub-pixel SP2 will be omitted.

In an embodiment, as shown in FIG. 5, the first sub-pixel SP1 may include a light emitting element OLED and a pixel circuit PXC connected to the light emitting element OLED to drive the light emitting element OLED. In an embodiment, the pixel circuit PXC may include first to seventh transistors T1 to T7 and a storage capacitor Cst, but not being limited thereto.

In an embodiment, as shown in FIG. 5, a first electrode of the first transistor T1 (driving transistor) may be connected to a first power source ELVDD via the fifth transistor T5, and a second electrode of the first transistor T1 may be connected to an anode electrode of the light emitting element OLED via the sixth transistor T6. In such an embodiment, a gate electrode of the first transistor T1 may be connected to a first node N1. The first transistor T1 may control an amount of current flowing from the first power source ELVDD to a second power source ELVSS via the light emitting element OLED, based on a voltage of the first node N1.

The second transistor T2 (switching transistor) may be connected between a j-th data line Dj and the first electrode of the first transistor T1. In addition, a gate electrode of the second transistor T2 may be connected to an i-th scan line Si. The second transistor T2 may be turned on when a scan signal is supplied to the i-th scan line Si, to electrically connect the j-th data line Dj and the first electrode of the first transistor T1.

The third transistor T3 may be connected between the second electrode of the first transistor T1 and the first node N1. In addition, a gate electrode of the third transistor T3 may be connected to the i-th scan line Si. The third transistor T3 may be turned on when a scan signal having a gate-on voltage is supplied to the i-th scan line Si, to electrically connect the second electrode of the first transistor T1 and the first node N1. Therefore, when the third transistor T3 is turned on, the first transistor T1 may be diode-connected.

The fourth transistor T4 (initialization transistor) may be connected between the first node N1 and an initialization power line IPL to which an initialization power source Vint is applied. In addition, a gate electrode of the fourth transistor T4 may be connected to an (i−1)-th scan line Si−1. The fourth transistor T4 may be turned on when a scan signal is supplied to the (i−1)-th scan line Si−1, to supply a voltage of the initialization power source Vint to the first node N1.

The fifth transistor T5 may be connected between a power line PL, to which the first power source ELVDD is applied, and the first transistor T1. In addition, a gate electrode of the fifth transistor T5 may be connected to an i-th emission control line Ei. The fifth transistor T5 may be turned off when an emission control signal having a gate-off voltage is supplied to the i-th emission control line, and be turned on otherwise.

The sixth transistor T6 may be connected between the first transistor T1 and the light emitting element OLED. In addition, a gate electrode of the sixth transistor T6 may be connected to the i-th emission control line Ei. The sixth transistor T6 may be turned off when an emission control signal having a gate-off voltage (e.g., a high level voltage) is supplied to the i-th emission control line Ei, and be turned on otherwise.

The seventh transistor T7 may be connected between the initialization power line IPL, to which the initialization power source Vint is applied, and a first electrode, e.g., the anode electrode of the light emitting element OLED. In addition, a gate electrode of the seventh transistor T7 may be connected to an (i+1)-th scan line Si+1. The seventh transistor T7 may be turned on when a scan signal having a gate-on voltage (e.g., a low level voltage) is supplied to the (i+1)-th scan line Si+1, to supply the voltage of the initialization power source Vint to the anode electrode of the light emitting element OLED. The voltage of the initialization power source Vint may be set to a voltage lower than that of a data signal. In an embodiment, the voltage of the initialization power source Vint may be set to a lowest voltage or less of the data signal. The signal applied to the gate electrode of the seventh transistor T7 may be a signal having a same timing as that of the scan signal having the gate-on voltage, which is supplied to the i-th scan line Si.

The storage capacitor Cst may be connected between the power line PL to which the first power source ELVDD is applied and the first node N1. The storage capacitor Cst may store a voltage corresponding to the data signal and a threshold voltage of the first transistor T1.

The anode electrode of the light emitting element OLED may be connected to the first transistor T1 via the sixth transistor T6, and a cathode electrode of the light emitting element OLED may be connected to the second power source ELVSS. The light emitting element OLED generates light with a predetermined luminance corresponding to an amount of current supplied from the first transistor T1. A voltage value of the first power source ELVDD may be set higher than that of the second power source ELVSS such that a current may flow through the light emitting element OLED.

The light emitting element OLED may be, for example, an organic light emitting diode. The light emitting element OLED may emit light of one of red, green, blue, and white. However, the disclosure is not limited thereto.

In embodiments, the structure of the first sub-pixel SP1 is not limited to the embodiment shown in FIG. 5. Alternatively, the pixel circuit PXC of the first sub-pixel SP1 may have one of various structures currently known in the art.

Figure 6:
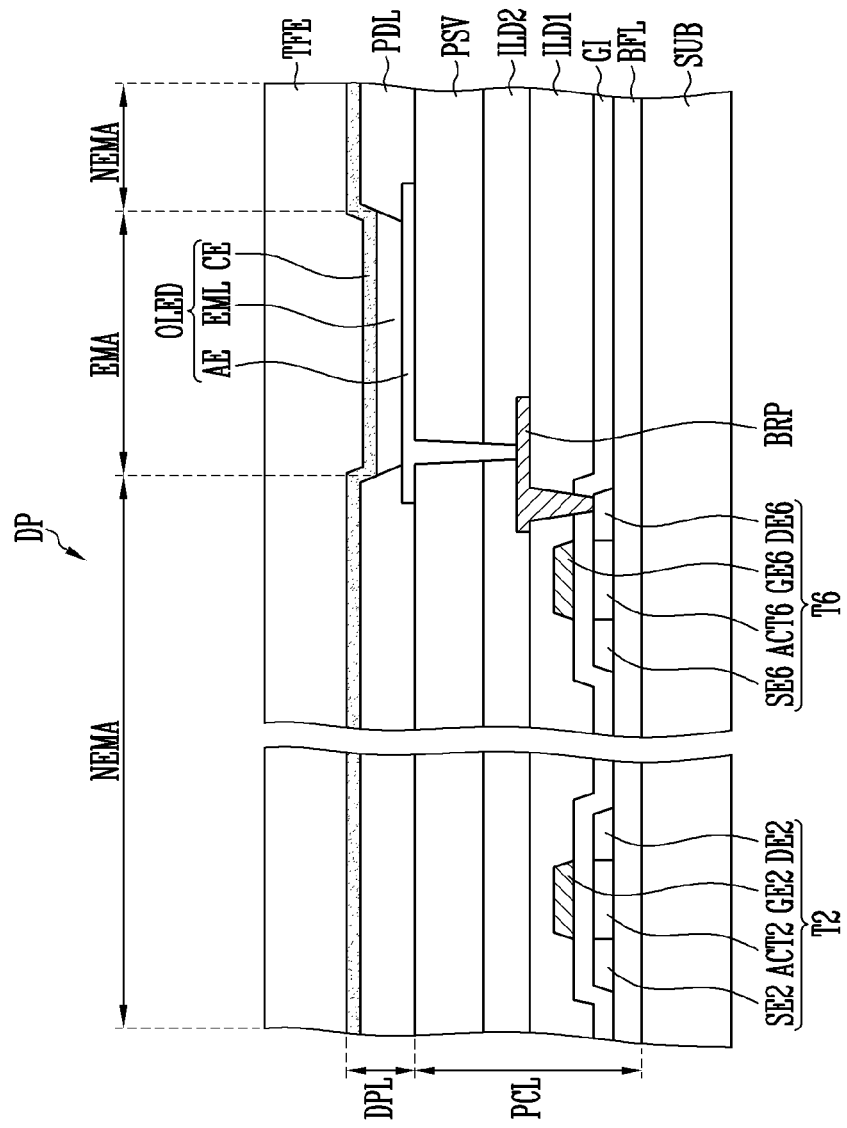
FIG. 6 is a schematic sectional view of the first sub-pixel shown in FIG. 4.

FIG. 6 is a schematic sectional view of the first sub-pixel shown in FIG. 4.

In FIG. 6, only a section of a portion corresponding to each of the second and sixth transistors T2 and T6 among the first to seventh transistors T1 to T7 shown in FIG. 5 is illustrated for convenience of illustration and description.

Referring to FIGS. 1A to 6, an embodiment of the display panel DP may include a substrate SUB, a pixel circuit layer PCL, a display element layer DPL, and a thin film encapsulation layer TFE.

The substrate SUB may include a transparent insulating material to enable light to be transmitted therethrough. The substrate SUB may have a single- or multi-layered structure.

The substrate SUB may be a rigid substrate. In one embodiment, for example, the rigid substrate may be one of a glass substrate, a quartz substrate, a glass ceramic substrate, and a crystalline glass substrate. In one embodiment, for example, the flexible substrate may include at least one material selected from polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

However, the material constituting the substrate SUB is not limited to those described above, and may be variously changed or modified.

The pixel circuit layer PCL may include a pixel circuit PXC including at least one insulating layer and at least one transistor. The display element layer DPL may include at least one light emitting element OLED.

The pixel circuit layer PCL may include insulating layers disposed on the substrate SUB, and the second and sixth transistor T2 and T6. The insulating layers may include a buffer layer BFL, a gate insulating layer GI, first and second interlayer insulating layers ILD1 and ILD2, and a passivation layer PSV, which are sequentially stacked one on another on the substrate SUB.

The buffer layer BFL may be disposed on the substrate SUB, and prevent an impurity from being diffused into the second and sixth transistors T2 and T6. The buffer layer BFL may be an inorganic insulating layer including an inorganic material. In an embodiment, the buffer layer BFL may include at least one material selected from silicon oxide (SiOx), silicon nitride (SiNx), silicon oxynitride (SiON), and a metal oxide such as aluminum oxide (AlOx). The buffer layer BFL may be a single layer, or a multi-layer including at least two layers. In an embodiment where the buffer layer BFL is the multi-layer, the layers therein may include or be formed of a same material as each other or different materials from each other. Alternatively, the buffer layer BFL may be omitted according to the material and process conditions of the substrate SUB.

The second transistor T2 may include a second gate electrode GE2, a second active pattern ACT2, a second source electrode SE2, and a second drain electrode DE2.

The second gate electrode GE2 may be connected to the i-th scan line Si. The second gate electrode GE2 may be integrally formed with the i-th scan line Si as a single unitary unit to be connected to the i-th scan line Si. The second gate electrode GE2 may be disposed or formed on the second active pattern ACT2 with the gate insulating layer GI interposed therebetween. The second gate electrode GE2 may include or be formed of at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu), but the disclosure is not limited thereto. The second electrode GE2 may be a single layer or a multi-layer.

The second active pattern ACT2, the second source electrode SE2, and the second drain electrode DE2 may be provided on the buffer layer BFL.

The second active pattern ACT2, the second source electrode SE2, and the second drain electrode DE2 may be a semiconductor pattern including or made of a poly-silicon, an amorphous silicon or an oxide semiconductor, for example. The second active pattern ACT2, the second source electrode SE2, and the second drain electrode DE2 may include or be formed of a semiconductor layer undoped or doped with an impurity. In an embodiment, the second source electrode SE2 and the second drain electrode DE2 may include or be formed of a semiconductor layer doped with the impurity, and the second active pattern ACT2 may include or be formed of a semiconductor layer undoped with the impurity.

The second active pattern ACT2 is a region overlapping the second gate electrode GE2, and may be a channel region of the second transistor T2. The second source electrode SE2 may be in contact with one end of the second active pattern ACT2, and the second drain electrode DE2 may be in contact with the other end of the second active pattern ACT.

The sixth transistor T6 may include a sixth gate electrode GE6, a sixth active pattern ACT6, a sixth source electrode SE6, and a sixth drain electrode DE6.

The sixth gate electrode GE6 may be disposed on the gate insulating layer GI, and be connected to the i-th emission control line Ei. The sixth gate electrode GE6 may be defined by a portion of the i-th emission control line Ei. The sixth gate electrode GE6 may be disposed in a same layer as the second gate electrode GE2, and include a same material as the second gate electrode GE2.

The sixth active pattern ACT6, the sixth source electrode SE6, and the sixth drain electrode DE6 may be disposed on the buffer layer BFL.

The sixth active pattern ACT6, the sixth source electrode SE6, and the sixth drain electrode DE6 may include or be formed of a semiconductor layer undoped or doped with an impurity. In one embodiment, for example, the sixth source electrode SE6 and the sixth drain electrode DE6 may include or be formed of a semiconductor layer doped with the impurity, and the sixth active pattern ACT6 may include or be formed of a semiconductor layer undoped with the impurity.

The sixth active pattern ACT6 is a region overlapping the sixth gate electrode GE6, and may be a channel region of the sixth transistor T6. The sixth source electrode SE6 may be in contact with one end of the sixth active pattern ACT6, and the sixth drain electrode DE6 may be in contact with the other end of the sixth active pattern ACT6. The sixth drain electrode DE6 may be electrically connected to a first electrode AE through a bridge pattern BRP disposed on the first interlayer insulating layer ILD1.

The gate insulating layer GI may be disposed or formed over the semiconductor layer of each of the second and sixth transistors T2 and T6. In an embodiment, the gate insulating layer GI may be disposed or formed over the second and sixth active patterns ACT2 and ACT6, the second and sixth source electrodes SE2 and SE6, and the second and sixth drain electrodes DE2 and DE6. The gate insulating layer GI may be an inorganic insulating layer including an inorganic material. In an embodiment, the gate insulating layer GI may include at least one of may include at least one material selected from silicon oxide (SiOx), silicon nitride (SiNx), silicon oxynitride (SiON), and a metal oxide such as aluminum oxide (AlOx). However, the material of the gate insulating layer GI is not limited to those described above. In an embodiment, the gate insulating layer GI may be an organic insulating layer including an organic material. The gate insulating layer GI may be a single layer, or a multi-layer including at least two layers. The gate electrodes GE2 and GE6 of the second and sixth transistors T2 and T6 may be disposed or formed on the gate insulating layer GI.

The bridge pattern BRP may be in contact with the sixth drain electrode DE6 of the sixth transistor T6, which corresponds thereto, through a contact hole defined through the gate insulating layer GI. The bridge pattern BRP may include or be made of at least one metal selected from aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). In an embodiment, the bridge pattern BRP may be a single layer or a multi-layer. In an embodiment, the bridge pattern BRP may have a stacked structure of Ti/Al/Ti, Mo/Al/Mo, Mo/AlGe/Mo, Ti/Cu, etc.

The first interlayer insulating layer ILD1 may be an inorganic insulating layer including an inorganic material. In an embodiment, the first interlayer insulating layer ILD1 may include at least one material selected from silicon oxide (SiOx), silicon nitride (SiNx), silicon oxynitride (SiON), and a metal oxide such as aluminum oxide (AlOx). The first interlayer insulating layer ILD1 may be a single layer, or a multi-layer including at least two layers.

Each of the second and sixth transistors T2 and T6 may be configured as a low-temperature polycrystalline silicon ("LTPS") thin film transistor, but the disclosure is not limited thereto. In an alternative embodiment, each of the second and sixth transistors T2 and T6 may be configured as an oxide semiconductor thin film transistor. In an embodiment, as shown in FIG. 6, each of the second and sixth transistors T2 and T6 is a thin film transistor having a top gate structure, but the disclosure is not limited thereto. In an alternative embodiment, each of the second and sixth transistors T2 and T6 may be a thin film transistor having a bottom gate structure.

The second interlayer insulating layer ILD2 may be disposed on the bridge pattern BRP. The second interlayer insulating layer ILD2 may be an inorganic insulating layer including an inorganic material or an organic insulating layer including an organic material. In an embodiment, the second interlayer insulating layer ILD2 may include a same material as the first interlayer insulating layer ILD1, but the disclosure is not limited thereto. The second insulating layer ILD2 may be a single layer, or a multi-layer including at least two layers.

The passivation layer PSV may be disposed on the second interlayer insulating layer ILD2. The passivation layer PSV may be in a form including an organic insulating layer, an inorganic insulating layer, or the organic insulating layer disposed on the inorganic insulating layer. The inorganic insulating layer may include at least one material selected from silicon oxide (SiOx), silicon nitride (SiNx), silicon oxynitride (SiON), and a metal oxide such as aluminum oxide (AlOx). The organic insulating layer may include an organic insulating material which enables light to be transmitted therethrough. In one embodiment, for example, the organic insulating layer may include at least one material selected from a photoresist, polyacrylates resin, epoxy resin, phenolic resin, polyamides resin, polyimides resin, unsaturated polyesters resin, poly-phenylene ethers resin, poly-phenylene sulfides resin, and benzocyclobutenes resin.

The display element layer DPL may include the light emitting element OLED which is disposed on the passivation layer PSV and emits light.

The light emitting element OLED may include first and second electrodes AE and CE, and an emitting layer EML disposed between the first and second electrodes AE and CE. One of the first and second electrodes AE and CE may be an anode electrode, and the other of the first and second electrodes AE and CE may be a cathode electrode. In an embodiment where the light emitting element OLED is a top-emission organic light emitting device, the first electrode AE may be a reflective electrode, and the second electrode CE may be a transmissive electrode. In such an embodiment, where the light emitting element OLED is the top-emission organic light emitting device, the first electrode AE may be the anode electrode.

The first electrode AE may be electrically connected to the sixth drain electrode DE6 of the sixth transistor T6 through a contact hole defined through the passivation layer PSV and the second interlayer insulating layer ILD2 and the bridge pattern BRP. The first electrode AE may include a reflective layer (not shown) capable of reflecting light and a transparent conductive layer (not shown) disposed on the top or bottom of the reflective layer. In an embodiment, the first electrode AE may be a multi-layer including a lower transparent conductive layer including indium tin oxide ("ITO"), a reflective layer disposed on the lower transparent conductive layer and including silver (Ag), and an upper transparent conductive layer disposed on the reflective layer and including indium tin oxide ("ITO"). At least one of the transparent conductive layer and the reflective layer may be electrically connected to the sixth drain electrode DE6 of the sixth transistor T6.

The display element layer DPL may further include a pixel defining layer PDL, in which an opening for exposing a portion of the first electrode AE, e.g., an upper surface of the first electrode AE, is defined. The pixel defining layer PDL may be an organic insulating layer including an organic material. In an embodiment, the pixel defining layer PDL may be an organic insulating layer such as acrylic resin, epoxy resin, phenolic resin, polyamide resin, or polyimide resin.

Each of the first and second sub-pixels SP1 and SP2 included in each first pixel region PXA1 in the first display region A1 may include an emission region EMA and a non-emission region NEMA adjacent to the emission region EMA. The non-emission region NEMA may surround the emission region EMA. In such an embodiment, the emission region EMA may be defined to correspond to a partial region of the first electrode AE, which is exposed by the opening of the pixel defining layer PDL, or the emitting layer EML.

The emitting layer EML may be disposed in a region corresponding to the opening of the pixel defining layer PDL. That is, the emitting layer EML may be separated or spaced apart from each of the first and second sub-pixels SP1 and SP2. The emitting layer EML may include an organic material and/or an inorganic material. In an embodiment of the disclosure, an emitting layer EML may be a patterned layer. However, in an alternative embodiments the emitting layer EML may be commonly provided as a single unitary layer in the first pixels PXL1. The color of light generated in the emitting layer EML may be one of red, green, blue, and white, but not being limited thereto. In one alternative embodiment, for example, the color of light generated in the emitting layer EML may be one of magenta, cyan, and yellow.

The second electrode CE may be disposed on the emitting layer EML. The second electrode CE may be commonly provided in the first and second pixels SP1 and SP2. The second electrode CE may be in a plate shape to entirely correspond to the first display region A1, but the disclosure is not limited thereto. The second electrode CE may include or be made of a transparent conductive oxide such as ITO, indium zinc oxide ("IZO"), aluminum zinc oxide ("AZO"), gallium doped zinc oxide ("GZO"), zinc tin oxide ("ZTO"), gallium tin oxide ("GTO"), or fluorine doped tin oxide ("FTO"), or a semi-transmissive metal such as magnesium (Mo), silver (Ag), or an alloy of magnesium (Mo) and silver (Ag).

A hole injection layer (not shown) may be disposed between the first electrode AE and the emitting layer EML, and an electron injection layer (not shown) may be disposed between the emitting layer EML and the second electrode CE. The hole injection layer and the electron injection layer may be commonly provided as a single unitary layer in the first and second sub-pixels SP1 and SP2.

The thin film encapsulation layer TFE may be disposed over the second electrode CE. The thin film encapsulation layer TFE may be a single layer, or a multi-layer. The thin film encapsulation layer TFE may include a plurality of insulating layers covering the light emitting element OLED. In an embodiment, the thin film encapsulation layer TFE may include at least one inorganic layer and at least one organic layer. In one embodiment, for example, the thin film encapsulation layer TFE may have a structure in which inorganic and organic layers are alternately stacked one on another.

Figure 7:
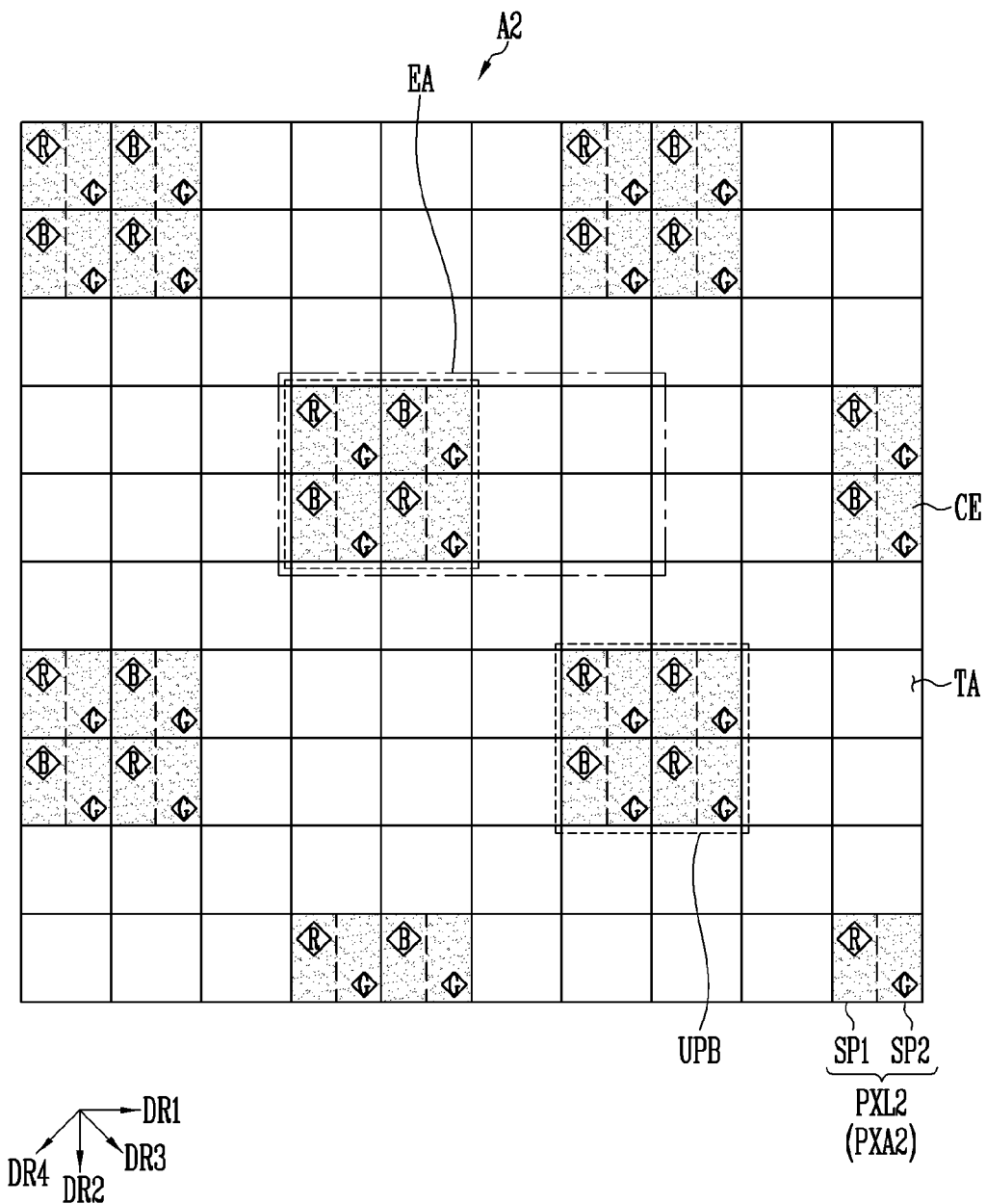
FIG. 7 is a plan view schematically illustrating a second display region in accordance with an embodiment of the disclosure.
Figure 8:
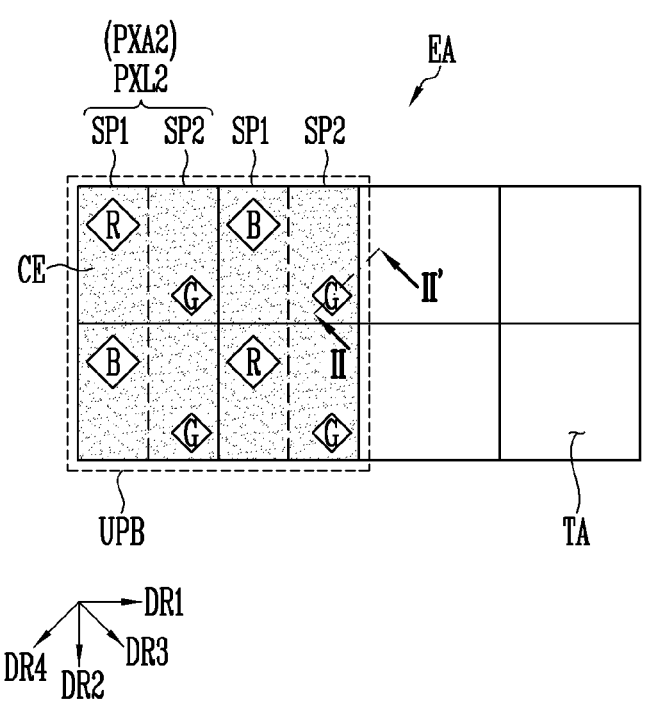
FIG. 8 is a schematic enlarged plan view of portion EA shown in FIG. 7.
Figure 9A:
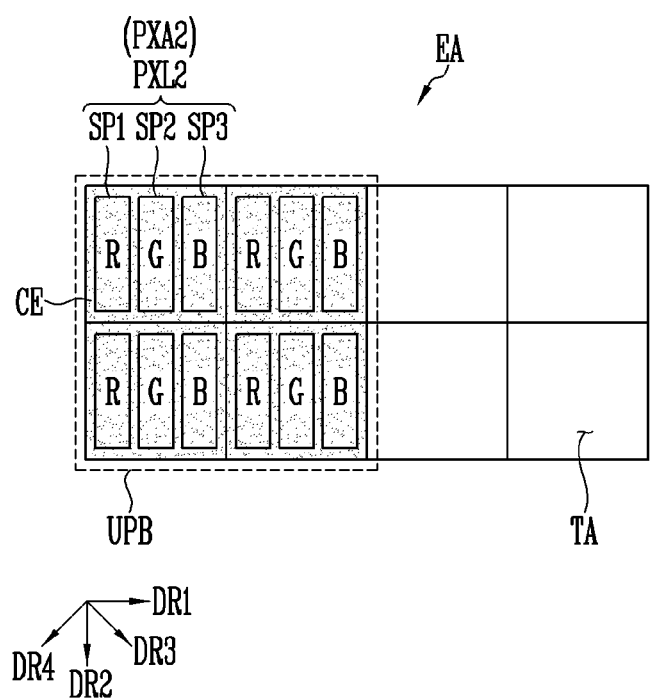
FIGS. 9A and 9B are schematic plan views illustrating alternative embodiments of a second pixel corresponding to the portion EA shown in FIG. 8.
Figure 9B:
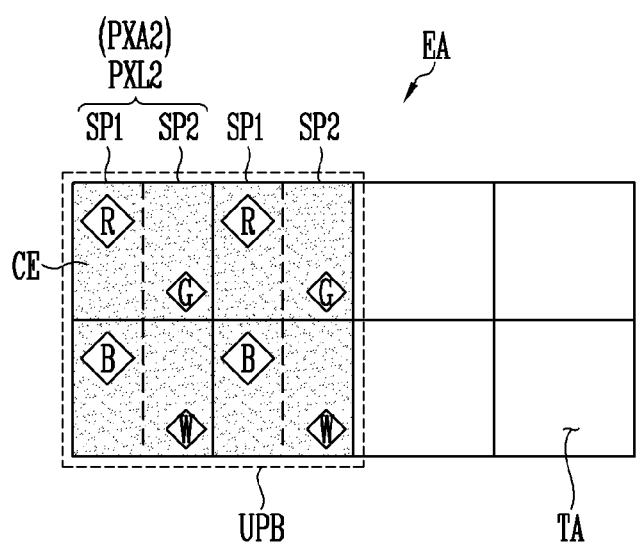
Figure 9B:
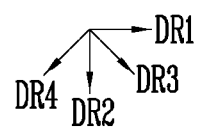
Figure 10:
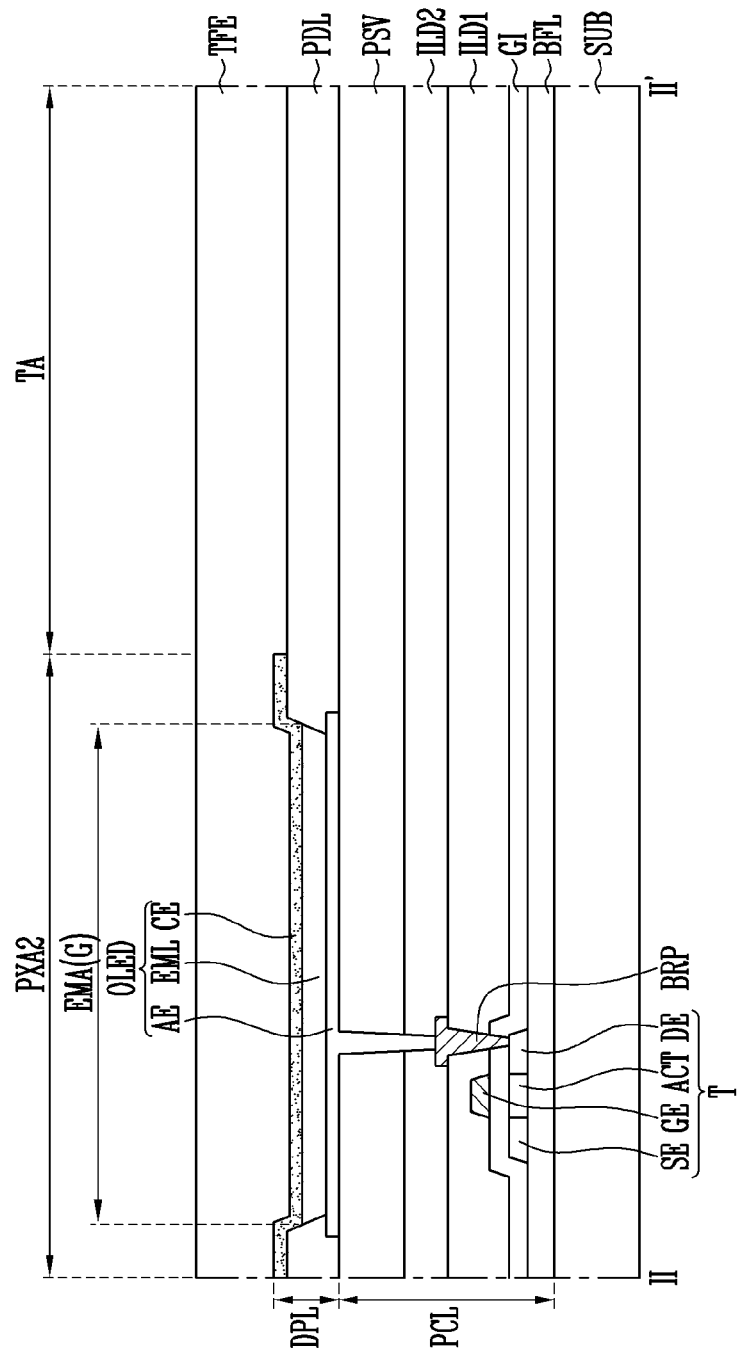
FIG. 10 is a sectional view taken along line II-II' shown in FIG. 8.
Figure 11A:
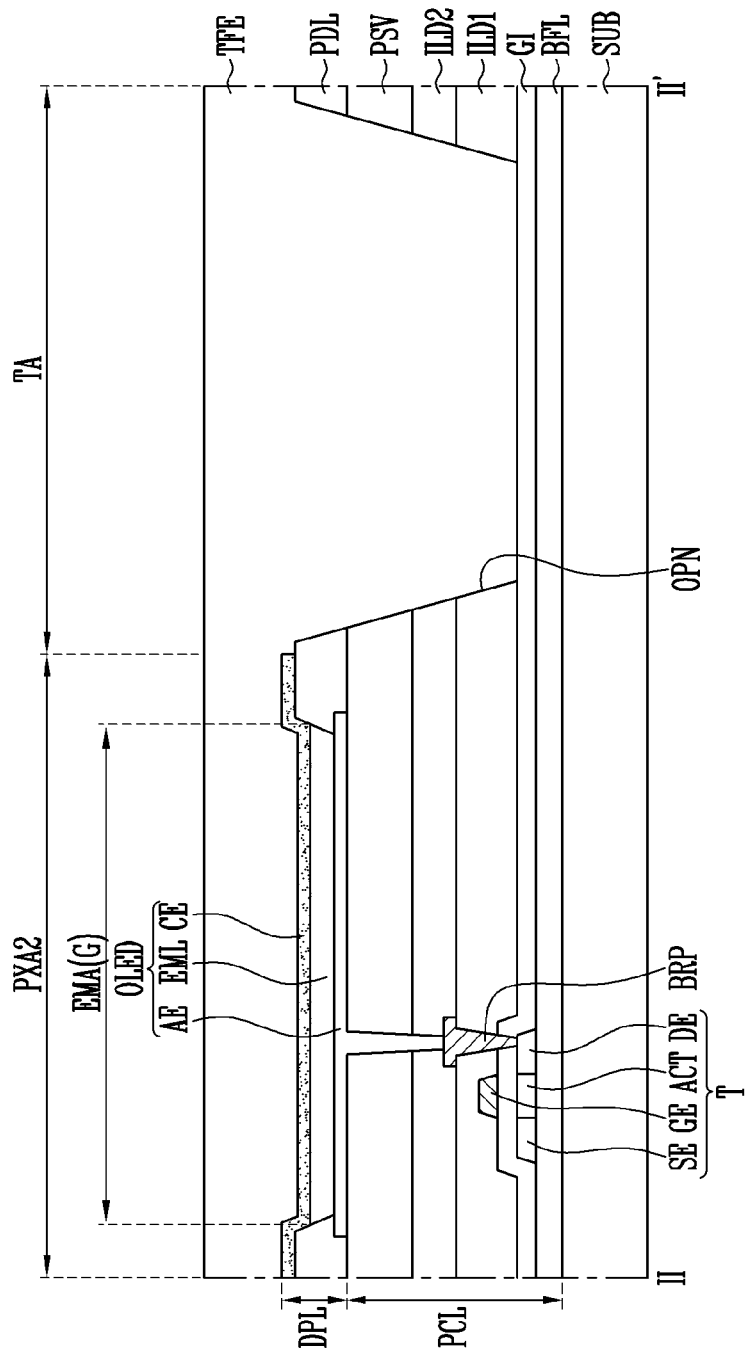
FIGS. 11A and 11B are sectional views illustrating alternative embodiments of a transmissive region corresponding to the line II-II' shown in FIG. 8.
Figure 11B:
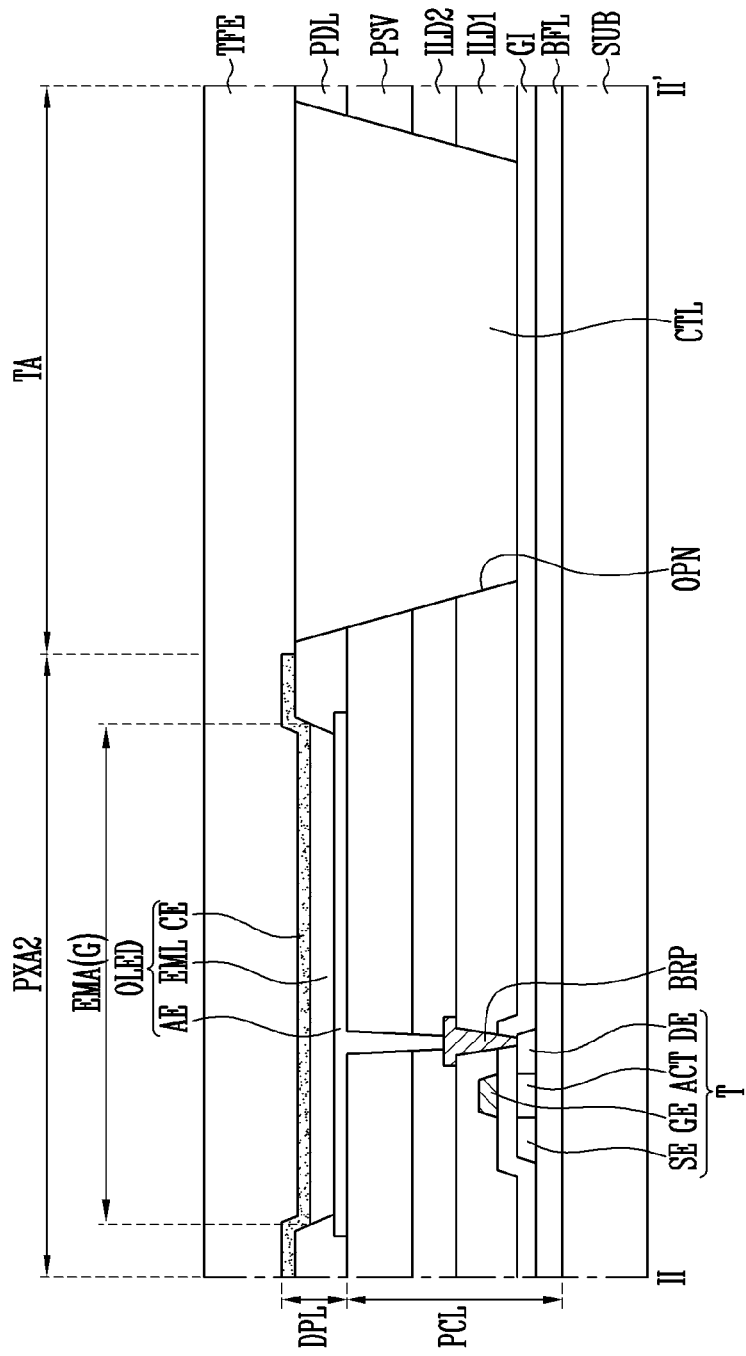

FIG. 7 is a plan view schematically illustrating a second display region in accordance with an embodiment of the disclosure. FIG. 8 is a schematic enlarged plan view of portion EA shown in FIG. EA. FIGS. 9A and 9B schematic plan views illustrating alternative embodiments of a second pixel corresponding to the portion EA shown in FIG. 8. FIG. 10 is a sectional view taken along line II-II' shown in FIG. 8. FIGS. 11A and 11B are sectional views illustrating alternative embodiments of a transmissive region corresponding to line II-II' shown in FIG. 8.

Referring to FIGS. 1A to 11B, an embodiment of the display panel DP may include a display region DA in which pixels PXL are arranged.

The display region DA may include a first display region A1 and a second display region A2, in which pixels PXL are disposed at different densities from each other. The pixels PXL may be disposed at different densities in the first display region A1 and the second display region A2. In an embodiment, first pixels PXL1 may be disposed at a first density in the first display region A1, and second pixels PXL2 may be disposed at a second density in the second display region A2. The second density may be smaller than the first density. In an embodiment, the first display region A1 and the second display region A2 may have different transmittances (e.g., light transmittances) from each other. Hereinafter, the first pixels PXL1 and the second pixels PXL2 will be collectively referred as pixels PXL.

In an embodiment of the disclosure, a density (or pixel density) may be defined as a total number of pixels PXL per unit area of a corresponding display region (PPI). Alternatively, the density (or pixel density) may be defined as a ratio (%) of an area in which the pixels PXL are disposed to a total area of the corresponding display region. The area in which the pixels PXL are disposed may be a total sum of areas of the respective pixels PXL. The area of each pixel PXL may mean an area of a region including an area of a pixel circuit PXC (or an area in which the pixel circuit PXC and a light emitting element OLED overlap with each other), an area of a plurality of signal lines (not shown) connected to the pixel circuit PXC, and the like. In an embodiment, the area of each pixel PXL may mean an area of a region including only a size of an emission region of the light emitting element OLED (e.g., a size of an emission region in which light is emitted). The size of the emission region of the light emitting element OLED may include the area in which the pixel circuit PXC and the light emitting element OLED overlap each other.

In an embodiment, the first density is defined as a ratio of an area in which the first pixels PXL1 are disposed to a total area of the first display region A1, and the second density is defined as a ratio of an area in which the second pixels PXL2 are disposed to a total area of the second display region A2.

The area in which the second pixels PXL2 with respect to the total area in the second display region A2 may be smaller than that in the first display area A1. That is, an area in which the pixels PXL are not disposed in the second display region A2 may be greater than that in the first display region A1. Since the second pixels PXL2 are disposed at a relatively low density in the second display region A2, a transmittance e.g., a light transmittance, of the second display region A2 may be higher than that of the first display region A1.

A configuration of the first pixels PXL1 of the first display region A1 and a configuration of the second pixels PXL2 of the second display region A2 may be different from each other.

In an embodiment, a material of signal lines connected to the first pixels PXL1 of the first display region A1 and a material of signal lines connected to the second pixels PXL2 of the second display region A2 may be different from each other. In one embodiment, for example, the signal lines connected to the first pixels PXL1 of the first display region A1 may include or be made of an opaque metal, and the signal lines connected to the second pixels PXL2 of the second display region A2 may include or be made of a transparent metal. In an alternative embodiment, the signal lines connected to the pixels PXL in the first display region A1 and the second display region A2 may include or be made of one of an opaque metal and a transparent metal, and an area ratio of signal lines made of the transparent metal in the second display region A2 may be higher than that of signal lines made of the transparent metal in the first display region A1. In an embodiment of the disclosure, a light transmittance of the transparent metal may be higher than that of the opaque metal, e.g., a reflective metal. As described above, when the ratio of signal lines made of the transparent metal in the second display region A2 is higher than that in the first display region A1, a transmittance per unit area (or a degree to which light transmitted per the same area) in the second display region A2 may be relatively higher than that in the first display region A1.

In an embodiment, a material of a first electrode AE of a light emitting element OLED included in the first pixels PXL1 of the first display region A1 and a material of a first electrode AE of a light emitting element OLED included in the second pixels PXL2 of the second display region A2 may be different from each other. In one embodiment, for example, the first electrode AE of the light emitting element OLED included in the first pixels PXL1 of the first display region A1 may include or be made of an opaque metal, and the first electrode AE of the light emitting element OLED included in the second pixels of the second display region A2 may be made of a transparent metal. In an alternative embodiment, the first electrodes AE of the pixels PXL in the first display region A1 and the second display region A2 may be made of one of an opaque metal and a transparent metal, and an area ratio of first electrodes AE made of the transparent metal in the second display region A2 may be higher than that of the first electrodes AE made of the transparent metal in the first display region A1.

In an embodiment, an area ratio of a second electrode CE per unit area in the first display region A1 and an area ratio of a second electrode CE per unit area in the second display region A2 may be different from each other. In one embodiment, for example, the area ratio of the second electrode CE per unit area in the second display region A2 may be smaller than that of the second electrode CE per unit area in the first display region A1.

In an embodiment, a layout (e.g., an arrangement relationship of components included in the pixel circuit PXC) of the first pixels PXL and a layout of the second pixels PXL2 may be different from each other. In one embodiment, for example, the signal lines connected to the second pixels PXL may be narrower than those connected to the first pixels PXL1, or the signal lines connected to the second pixels PXL2 may be disposed to overlap each other with an insulating layer interposed therebetween. Accordingly, the area occupied by the signal lines in the second display region A2 is reduced while securing a distance between the signals lines, so that the light transmittance of the second display region A2 can be improved.

In an embodiment, as shown in FIGS. 7 and 8, each of the second pixels PXL2 may include a first sub-pixel SP1 and a second sub-pixel SP2. The first sub-pixel SP1 may be a red pixel for emitting red light R or a blue pixel for emitting blue light B, and the second sub-pixel SP2 may be a green pixel for emitting green light G. Each second pixel PXL2 may be disposed in a second pixel region PXA2, and implement colored light and/or white light by combining lights respectively emitted from the first and second sub-pixels SP1 and SP2. In an embodiment, as described above, the first and second sub-pixels SP1 and SP2 constitute one second pixel PXL2, but the disclosure is not limited thereto. In an alternative embodiment, each second pixel PXL2 may include three sub-pixels or four sub-pixels.

In an alternative embodiment, as shown in FIG. 9A, each second pixel PXL2 may include first to third sub-pixels SP1 to SP3 arranged in a same sub-pixel row along a first direction D1. The first to third sub-pixels SP1 to SP3 may be arranged in an arrangement structure having a stripe shape in each second pixel region PXA2. The first sub-pixel SP1 may be a red pixel for emitting red light R, the second sub-pixel SP2 may be a green pixel for emitting green light G, and the third sub-pixel SP3 may be a blue pixel for emitting blue light B. The first to third sub-pixels SP1 to SP3 may have an emission region having a rectangular structure, and may have a same area (or size) or similar areas as each other.

In another alternative embodiment, as shown in FIG. 9B, one second pixel PXL2 may include first and second sub-pixels SP1 and SP2. The first sub-pixel SP1 may be a red pixel for emitting red light R or a blue pixel for emitting blue light B, and the second sub-pixel SP2 may be a green pixel for emitting green light G or a white pixel for emitting white light W. The first sub-pixel SP1 may be repeatedly disposed along a second direction DR2 to constitute a first sub-pixel column. In an embodiment, in the sub-pixel column, the first sub-pixels SP1 may be in an order of a first sub-pixel SP1 for emitting red light R, a first sub-pixel SP1 emitting blue light B, . . . . The second sub-pixel SP2 may be repeatedly arranged along the second direction DR2 to constitute a second sub-pixel column. In an alternative embodiment, in the second sub-pixel column, the second sub-pixels SP2 may be arranged in an order of a second sub-pixel SP2 for emitting green light G, a second sub-pixel SP2 for emitting white light W, . . . .

Each of the first and second sub-pixels SP1 and SP2 may include a pixel circuit layer PCL including at least one transistor and a display element layer DPL including a light emitting element OLED. The first and second sub-pixels SP1 and SP2 may substantially have similar structures or a same structure as each other. Accordingly, a configuration of the second sub-pixel SP2 will hereinafter be described in detail with reference to FIG. 10, and any repetitive detailed description of a configuration of the first sub-pixel SP1 will be omitted.

The second sub-pixel SP2 may include a substrate SUB, a pixel circuit layer PCL including a pixel circuit (see PXC shown in FIG. 5) with at least one transistor, a display element layer DPL disposed on the pixel circuit layer PCL, and a thin film encapsulation layer TFE covering the display element layer DPL. The thin film encapsulation layer TFE may be substantially the same as the thin film encapsulation layer TFE of the first display region A1 described above with reference to FIG. 6. For convenience of illustration and description, only a driving transistor T for driving the light emitting element OLED is illustrated in FIG. 10. The driving transistor T shown in FIG. 10 may be the same component as the first transistor T1 shown in FIG. 5.

The pixel circuit layer PCL may include the driving transistor T and at least one insulating layer. The insulating layer may include a buffer layer BFL, a gate insulating layer GI, first and second interlayer insulating layers ILD1 and ILD2, and a passivation layer PSV, which are sequentially stacked one on another on the substrate SUB. The buffer layer BFL, the gate insulating layer GI, the first and second interlayer insulating layers ILD1 and ILD2, and the passivation layer PSV may be substantially the same as the buffer layer BFL, the gate insulating layer GI, the first and second interlayer insulating layers ILD1 and ILD2, and the passivation layer PSV of the first display region A1 described above with reference to FIG. 6. The driving transistor T may include an active pattern ACT, a gate electrode GE, a source electrode SE and a drain electrode DE, and be configured as a thin film transistor having a same structure as the second and sixth transistors T2 and T6 of the first display region A1 shown in FIG. 6.

The display element layer DPL may include the light emitting element OLED including a first electrode AE, an emitting layer EML, and a second electrode CE. The emitting layer EML may emit green light G. An emission region EMA of the second sub-pixel SP2 is a region in which green light G is emitted, and may be defined (or partitioned) to correspond to one region of the first electrode AE or the emitting layer EML, which is exposed by an opening of a pixel defining layer PDL.

In an embodiment, as shown in FIG. 7, a plurality of unit pixel blocks UPB may be defined in the second display region A2, and the unit pixel bocks UPB are repeatedly arranged with a predetermined distance. Each of the unit pixel blocks UPB may be a virtual unit block having a predetermined area, which includes two second pixel PXL2 adjacent to each other in the first direction DR1 and two second pixels PXL2 adjacent to the two second pixels PXL2 in the second direction DR2 intersecting the first direction DR1. In an embodiment, in the second display region A2, each unit pixel block UPB may be defined by grouping, as one group, four second pixels PXL2 disposed adjacent to each other along the first direction DR1 and the second direction DR2. However, the disclosure is not limited thereto. In an alternative embodiment, the unit pixel blocks UPB may be designed or modified based on a desired transmittance (or light transmittance).

In an embodiment, as shown in FIG. 10, the second display region A2 may include a transmissive region through which light is transmitted. In an embodiment of the disclosure, the transmissive region TA may be a region except the unit pixel blocks UPB in the second display region A2, and be a transmissive window (or transparent window) in which the second pixel PXL2 are not disposed. That is, the transmissive region TA may be a region in which some components (e.g., the pixel circuit (see PXC shown in FIG. 5) of the pixel circuit layer PCL included in each second pixel PXL2 and some components (e.g., the light emitting element OLED) of the display element layer DPL are omitted or not provided. Since some components of each of the pixel circuit layer PCL and the display element layer DPL are not disposed in the transmissive region TA, only an insulating layer provided between components between the pixel circuit layer PCL or between components included in the display element layer DPL may be disposed in the transmissive region TA. In such an embodiment, the transmissive region TA may be provided in a manner that does not arrange (or have) components included in the first and second sub-pixels SP1 and SP2, e.g., the pixel circuit layer PCL and the display element layer DPL.

In an embodiment, as shown in FIG. 10, the transmissive region TA may serve as a transmissive window in which only the buffer layer BFL, the gate insulating layer GI, the first and second interlayer insulating layers ILD1 and ILD2, the passivation layer PSV, the pixel defining layer PDL, and the thin film encapsulation layer TFE are sequentially stacked on the substrate SUB to allow incident light to be transmitted therethrough.

The transmissive region TA may be a region in which the second electrode CE which may have greatest influence on light transmittance is omitted or removed. The second electrode CE2 may be selectively disposed in the second display region A2. That is, the second electrode CE is disposed in only the second pixel regions PXA2, and may not be provide in the transmissive region TA.

In an alternative embodiment, as shown in FIG. 11A, the transmissive region TA may include an opening OPN for minimizing loss of light advancing toward the transmissive region TA. In an embodiment of the disclosure, the opening OPN may be formed by removing a portion of an insulating layer corresponding to the transmissive region TA. In one embodiment, for example, the opening OPN may be formed by removing the first and second interlayer insulating layers ILD1 and ILD2, the passivation layer PSV, and the pixel defining layer PDL in the transmissive region TA. However, the insulating layers removed to form the opening OPN are not limited to those described above. In one alternative embodiment, for example, the gate insulating layer GI or the buffer layer BFL may also be removed to form the opening OPN.

In an embodiment, where the opening OPN is defined or formed in the transmissive region TA, the opening OPN may be provided in a form in which the thin film encapsulation layer TFE fill the opening OPN. The thin film encapsulation layer TFE may include or be made of a material (or substance) which allows light to be transmitted therethrough to minimize loss of light penetrating (or passing through) the opening OPN. In another alternative embodiment, where the opening OPN is defined or formed in the transmissive region TA, the opening OPN may be provided in a form in which an intermediate layer CTL fills the opening OPN as shown in FIG. 11B. In an embodiment, the intermediate layer CTL may be an air layer which fills the opening OPN to minimize loss of light penetrating (or passing through) the opening OPN. In an alternative embodiment, the intermediate layer CTL may be a transparent adhesive layer (or cohesive layer), e.g., an optically clear adhesive for reinforcing adhesion between insulating layers, e.g., the gate insulating layer GI and the thin film encapsulation layer TFE, which are exposed by the opening OPN, while minimizing loss of light penetrating (or passing through) the opening OPN. The material of the intermediate layer CTL is not limited to those described above, and may be variously selected from materials for minimizing loss of light penetrating (or passing through) the transmissive region TA.

In an embodiment, as described above, the second display region A2 includes the transmissive region TA in which the second pixels PXL2 are not disposed, to have a relatively high light transmittance per unit area, as compared with the first display region A1.

The second display region A2 may overlap a sensor SR which is disposed on the bottom of the substrate SUB, and receives light or emits light. Since the transmissive region TA, through which light is transmitted, is provided in the second display region A2, the amount (or intensity) of light incident into the sensor SR disposed to correspond to the second display region A2 increases, so that the sensing capability (e.g., sensing accuracy, or recognition rate) of the sensor SR may be improved.

Figure 12:
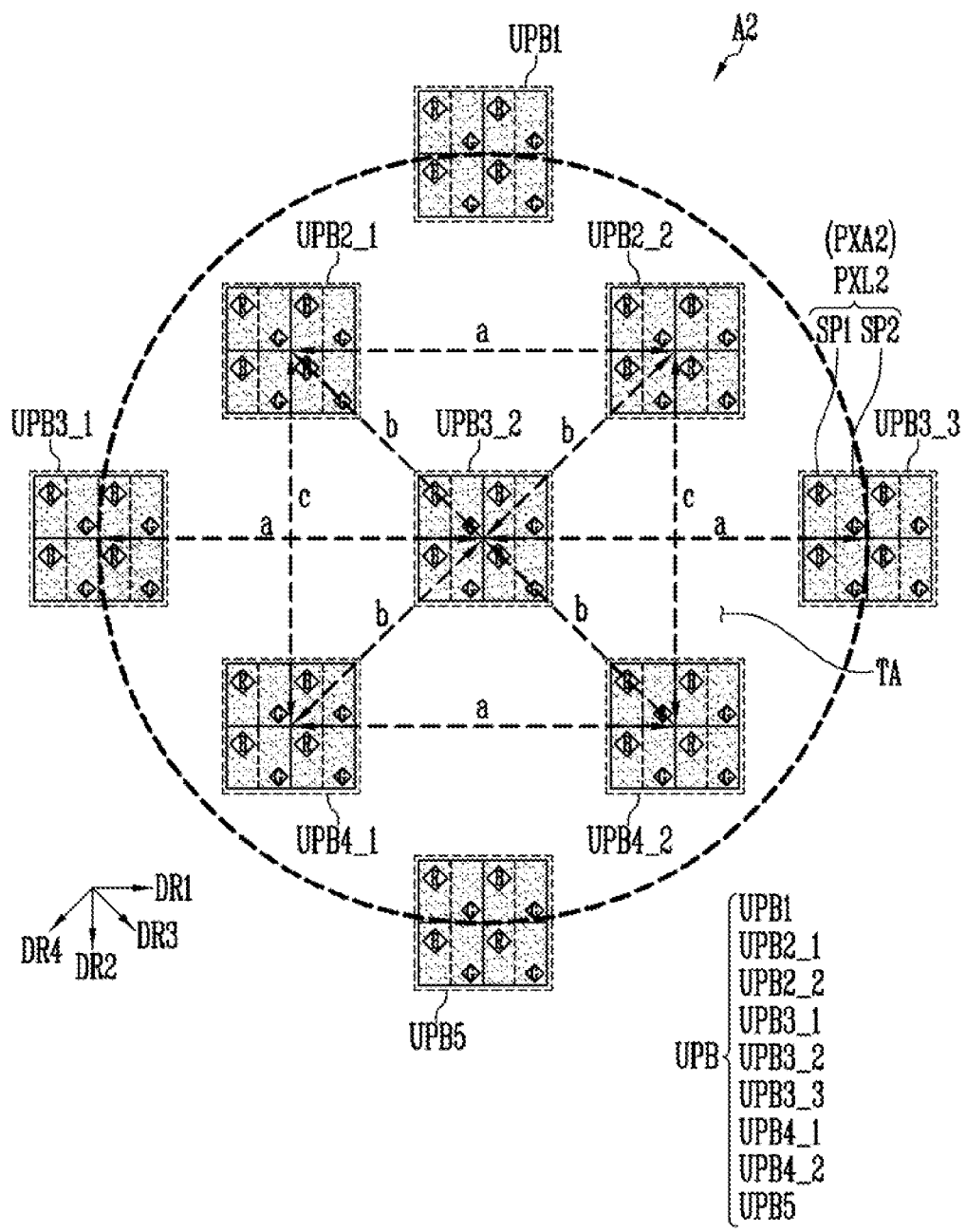
FIG. 12 is a plan view schematically illustrating an arrangement of unit pixel blocks of the second display region in accordance with an embodiment of the disclosure.

FIG. 12 is a plan view schematically illustrating an arrangement of unit pixel blocks of the second display region in accordance with an embodiment of the disclosure.

Referring to FIGS. 1 to 12, at least one region of the second display region A2 may include a plurality of unit pixel blocks UPB and a transmissive region TA.

In an embodiment, as shown in FIG. 12, each of the unit pixel blocks UPB may include four second pixels PXL2. The transmissive region TA may be located between the unit pixel blocks UPB.

In an embodiment of the disclosure, each of the unit pixel blocks UPB disposed in the at least one region of the second display region A2 may be disposed to be spaced apart from adjacent unit pixel blocks UPB located in the same unit pixel block row in a first direction DR1 (e.g., a horizontal direction or row direction), be disposed to be spaced apart from adjacent unit pixel blocks UPB located in the same unit pixel block column in a second direction DR2 (e.g., a vertical direction or column direction), be disposed to be spaced apart from a unit pixel block UPB adjacent thereto in a third direction DR3 (e.g., a direction inclined (or oblique) to the first direction DR1), and be disposed to be spaced apart from a unit pixel block UPB adjacent thereto in a fourth direction DR4 (e.g., a direction inclined (or oblique) to the second direction DR2).

Hereinafter, for convenience of description, different names and different reference numerals will be given with respect to each of the unit pixel blocks UPB disposed in the at least one region of the second display region A2. As shown in FIG. 12, in an embodiment where nine unit pixel blocks UPB are disposed in the at least one region of the second display region A2, one unit pixel block UPB located in a first unit pixel block row is designated as a first unit pixel block UPB1, two unit pixel blocks UPB located in a second unit pixel block row are designated as first second and second second unit pixel blocks UPB2_1 and UPB2_2, and three unit pixel blocks UPB located in a third unit pixel block row are designated as first third, second third, and third third unit pixel blocks UPB3_1, UPB3_2, and UPB3_3. In addition, two unit pixel blocks UPB located in a fourth unit pixel block row are designated as first fourth and second fourth unit pixel blocks UPB4_1 and UPB4_2, and one unit pixel block UPB located in a fifth unit pixel block row is designated as a fifth unit pixel block UPB5.

The second third unit pixel block UPB3_2 may be spaced apart from the first third unit pixel block UPB3_1 located in the same unit pixel block row in the first direction DR1 at a predetermined distance, e.g., a distance a, as shown in FIG. 12. In an embodiment of the disclosure, a distance between the first third and second third unit pixel blocks UPB3_1 and UPB3_2 located in the same unit pixel block row in the first direction DR1 may mean a distance between the center (or middle) of the first third unit pixel block UPB3_1 and the center (or middle) of the second third unit pixel block UPB3_2, or a distance between a pixel circuit (see 'PXC' shown in FIG. 5) included in the first third unit pixel block UPB3_1 and a corresponding pixel circuit PXC included in the second third unit pixel block UPB3_2 in the first direction DR1. Herein, corresponding pixel circuits in different unit pixel blocks mean pixels circuits in a same position within the different unit pixel blocks.

In such an embodiment, the second third unit pixel block UPB3_2 may be spaced apart from the third third unit pixel block UPB3_3 located in the same unit pixel block row in the first direction DR1 at a predetermined distance, e.g., the distance a. A distance between the second third unit pixel block UPB3_2 and the third third unit pixel block UPB3_3 may be equal to that between the second third unit pixel block UPB3_2 and the first third unit pixel block UPB3_1. The distance between the second third unit pixel block UPB3_2 and the third third unit pixel block UPB3_3 may mean a distance between a pixel circuit PXC included in the second third unit pixel block UPB3_2 and a corresponding pixel circuit PXC included in the third third unit pixel block UPB3_3 in the first direction DR1.

The second third unit pixel block UPB3_2 may be spaced apart from the first second unit pixel block UPB2_1 adjacent thereto in the third direction DR3 at a predetermined distance, e.g., a distance b, as shown in FIG. 12. In an embodiment of the disclosure, a distance between the first second unit pixel block UPB2_1 and the second third unit pixel block UPB3_2, which are adjacent to each other in the third direction DR3, may mean a distance between the center (or middle) of the first second unit pixel block UPB2_1 and the center (or middle) of the second third unit pixel block UPB3_2, or a distance between a pixel circuit PXC included in the first second unit pixel block UPB2_1 and a corresponding pixel circuit PXC included in the second third unit pixel block UPB3_2.

The first second unit pixel block UPB2_1 may be spaced apart from the first fourth unit pixel block UPB4_1 located in the same unit pixel block row in the second direction DR2 at a predetermined distance, e.g., a distance c, as shown in FIG. 12. A distance between the first second unit pixel block UPB2_1 and the first fourth unit pixel block UPB4_1 (e.g., the distance c) may be equal to that between the second third unit pixel block UPB3_2 and the first third unit pixel block UPB3_1 in the first direction DR1 (e.g., the distance a). However, the disclosure is not limited thereto. In an alternative embodiment, the distance between the first second unit pixel block UPB2_1 and the first fourth unit pixel block UPB4_1 (e.g., the distance c) may be different from that between the second third unit pixel block UPB3_2 and the first third unit pixel block UPB3_1 in the first direction DR1 (e.g., the distance a). In an embodiment of the disclosure, a distance between the first second unit pixel block UPB2_1 and the first fourth unit pixel block UPB4_1, which are adjacent to each other in the second direction DR2, may mean a distance between the center (or middle) of the first second unit pixel block UPB2_1 and the center (or middle) of the first fourth unit pixel block UPB4_1, or a distance between a pixel circuit PXC included in the first second unit pixel block UPB2_1 and a corresponding pixel circuit PXC included in the first fourth unit pixel block UPB4_1 in the second direction DR2.

In an embodiment, a distance between the first second unit pixel block UPB2_1 and the second second unit pixel block UPB2_2, which are located in the same unit pixel block row in the first direction DR1, may be equal to that between the second third unit pixel block UPB3_2 and the third third unit pixel block UPB3_3 in the first direction DR1. In such an embodiment, the distance between the first second unit pixel block UPB2_1 and the second second unit pixel block UPB2_2 may be the distance a, as shown in FIG. 12. In an embodiment of the disclosure, a distance between the first second unit pixel block UPB2_1 and the second second unit pixel block UPB2_2 in the first direction DR1 may mean a distance between the center (or middle) of the first second unit pixel block UPB2_1 and the center (or middle) of the second second unit pixel block UPB2_2, or a distance between a pixel circuit included in the first second unit pixel block UPB2_1 and a corresponding pixel circuit PXC included in the second second unit pixel block UPB2_2 in the first direction DR1.

The second third unit pixel block UPB3_2 may be spaced apart from the second fourth unit pixel block UPB4_2 adjacent thereto in the third direction DR3 at a predetermined distance, e.g., the distance b, as shown in FIG. 12. In such an embodiment of the disclosure, a distance between the second third unit pixel block UPB3_2 and the second fourth unit pixel block UPB4_2, which are adjacent to each other in the third direction DR3, may be equal to that between the second third unit pixel block UPB3_2 and the first second unit pixel block UPB2_1. The distance between the second third unit pixel block UPB3_2 and the second fourth unit pixel block UPB4_2 may mean a distance between a pixel circuit PXC included in the second third unit pixel block UPB3_2 and a corresponding pixel circuit PXC included in the second fourth unit pixel block UPB4_2 in the third direction DR3, may be the distance b.

The second third unit pixel block UPB3_2 may be spaced apart from the second second unit pixel block UPB2_2 adjacent thereto in the fourth direction DR4 at a predetermined distance, e.g., the distance b, as shown in FIG. 12. In such an embodiment of the disclosure, a distance between the second second unit pixel block UPB2_2 and the second third unit pixel block UPB3_2, which are adjacent to each other in the fourth direction DR4, may mean a distance between the center (or middle) of the second second unit pixel block UPB2_2 and the center (or middle) of the second third unit pixel block UPB3_2, or a distance between a pixel circuit PXC included in the second second unit pixel block UPB2_2 and a corresponding pixel circuit PXC included in the second third unit pixel block UPB3_2 in the fourth direction DR4.

The second second unit pixel block UPB2_2 may be spaced apart from the second fourth unit pixel block UPB4_2 located in the same unit pixel block column in the second direction DR2 at a predetermined distance, e.g., the distance c, as shown in FIG. 12. A distance between the second second unit pixel block UPB2_2 and the second fourth unit pixel block UPB4_2 may be equal to that between the first second unit pixel block UPB2_1 and the first fourth unit pixel block UPB4_1 in the second direction DR2. In an embodiment, the distance between the second second unit pixel block UPB2_2 and the second fourth unit pixel block UPB4_2 (e.g., the distance c) may be equal to or different from that between the second third unit pixel block UPB3_2 and the third third unit pixel block UPB3_3 in the first direction DR1 (e.g., the distance a). In an embodiment of the disclosure, the distance between the second second unit pixel block UPB2_2 and the second fourth unit pixel block UPB4_2, which are adjacent to each other in the second direction DR2, may mean a distance between the center (or middle) of the second second unit pixel block UPB2_2 and the center (or middle) of the second fourth unit pixel block UPB4_2, or a distance between a pixel circuit PXC included in the second second unit pixel block UPB2_2 and a corresponding pixel circuit PXC included in the second fourth unit pixel block UPB4_2 in the second direction DR2.

In an embodiment, the second third unit pixel block UPB3_2 may be spaced apart from the first fourth unit pixel block UPB4_1 adjacent thereto in the fourth direction DR4 at a predetermined distance, e.g., the distance b, as shown in FIG. 12. In an embodiment of the disclosure, a distance between the second third unit pixel block UPB3_2 and the first fourth unit pixel block UPB4_1 may be equal to that between the second third unit pixel block UPB3_2 and the second second unit pixel block UPB2_2, or a distance between a pixel circuit PXC included in the second third unit pixel block UPB3_2 and a corresponding pixel circuit PXC included in the first fourth unit pixel block UPB4_1 in the fourth direction DR4.

A distance between the first fourth unit pixel block UPB4_1 and the second fourth unit pixel block UPB4_2, which are located in the same unit pixel block row in the first direction DR1, may be equal to that between the second third unit pixel block UPB3_2 and the third third unit pixel block UPB3_3 in the first direction DR1. In an embodiment of the disclosure, the distance between the first fourth unit pixel block UPB4_1 and the second fourth unit pixel block UPB4_2, which are adjacent to each other in the first direction DR1, may mean a distance between the center (or middle) of the first fourth unit pixel block UPB4_1 and the center (or middle) of the second fourth unit pixel block UPB4_2, or a distance between a pixel circuit PXC included in the first fourth unit pixel block UPB4_1 and a corresponding pixel circuit PXC included in the second fourth unit pixel block UPB4_2 in the first direction DR1.

In an embodiment, as described above, a distance between the second third unit pixel block UPB3_2 and one unit pixel block UPB2_1 and/or UPB4_2 adjacent to the second third unit pixel block UPB3_2 in the third direction DR3 (e.g., the distance b) and a distance between the second third unit pixel block UPB3_2 and one unit pixel block UPB2_2 and/or UPB4_1 adjacent to the second third unit pixel block UPB3_2 in the fourth direction DR4 (e.g., the distance b) may be equal to each other.

In an embodiment of the disclosure, with respect to the second third unit pixel block UPB3_2, a distance between two unit pixel blocks UPB3_2 and UPB3_1, or UPB3_2 and UPB3_3 which are located in the same unit pixel block row in the first direction DR1 and are adjacent to each other (e.g., the distance a) may be greater than that between two unit pixel blocks UPB3_2 and UPB2_1, or UPB3_2 and UPB4_2 disposed adjacent to each other in the third direction DR3 (e.g., the distance b). In such an embodiment, each of the first second and second fourth unit pixel blocks UPB2_1 and UPB4_2 which face each other in the third direction DR3 with the second third unit pixel block UPB3_2 interposed therebetween may be spaced apart from one unit pixel block UPB2_2 and/or UPB4_1 located in the same unit pixel block column in the second direction DR2 at a predetermined distance, e.g., the distance c. The distance c may be equal to that between the second third unit pixel block UPB3_2 and one unit pixel block UPB3_1 and/or UPB3_3 located in the same unit pixel block row in the first direction DR1, e.g., the distance b. In such an embodiment, with respect to the second third unit pixel block UPB3_2, a distance between two unit pixel blocks UPB3_2 and UPB3_1, or UPB3_2 and UPB3_3 which are located in the same unit pixel block row in the first direction DR1 and are adjacent to each other (e.g., the distance a) may be greater than that between two unit pixel blocks UPB3_2 and UPB2_2, or UPB3_2 and UPB4_1 disposed adjacent to each other in the fourth direction DR4 (e.g., the distance b). In an embodiment, a distance between the two unit pixel blocks UPB3_2 and UPB2_1, or UPB3_2 and UPB4_2 adjacent to each other in the third direction DR3 (e.g., the distance a) may satisfy the following equation: $b=\sqrt{2}a/2$.

Here, a denotes a distance between two unit pixel blocks UPB3_2 and UPB3_1, or UPB3_2 and UPB3_3 which are located in the same unit pixel block row in the first direction DR1 and are adjacent to each other, and b denotes the distance between the two unit pixel blocks UPB3_2 and UPB2_1, or UPB3_2 and UPB4_2 adjacent to each other in the third direction DR3. In an embodiment, the distance a is equal to the distance c between two unit pixel blocks UPB2_1 and UPB4_1, or UPB2_2 and UPB4_2 which are located in the same unit pixel block in the second direction DR2 and are adjacent to each other, the distance between two unit pixel blocks UPB3_2 and UPB2_1, or UPB3_2 and UPB4_2 adjacent to each other in the third direction DR3 (e.g., the distance b) may be determined based on the distance a and the distance c.

In an embodiment, where unit pixel blocks UPB are disposed in at least one region of the second display region A2 as described above, at least one region of the transmissive region TA, which is surrounded between the unit pixel blocks UPB, may constitute a transmissive window which has a shape substantially close to a circular shape or has a circular shape. In such an embodiment, a diffraction phenomenon of light penetrating (or passing through) the transmissive window is reduced, so that a larger amount of light may be introduced (or incident) to the sensor SR overlapping the second display region A2. In such an embodiment, the sensing capability (e.g., sensing accuracy, or recognition rate) of the sensor SR may be improved as the amount of light introduced (or incident) to the sensor SR increases. Accordingly, the quality of an image acquired in or captured by the sensor SR may be improved.

Figure 13:
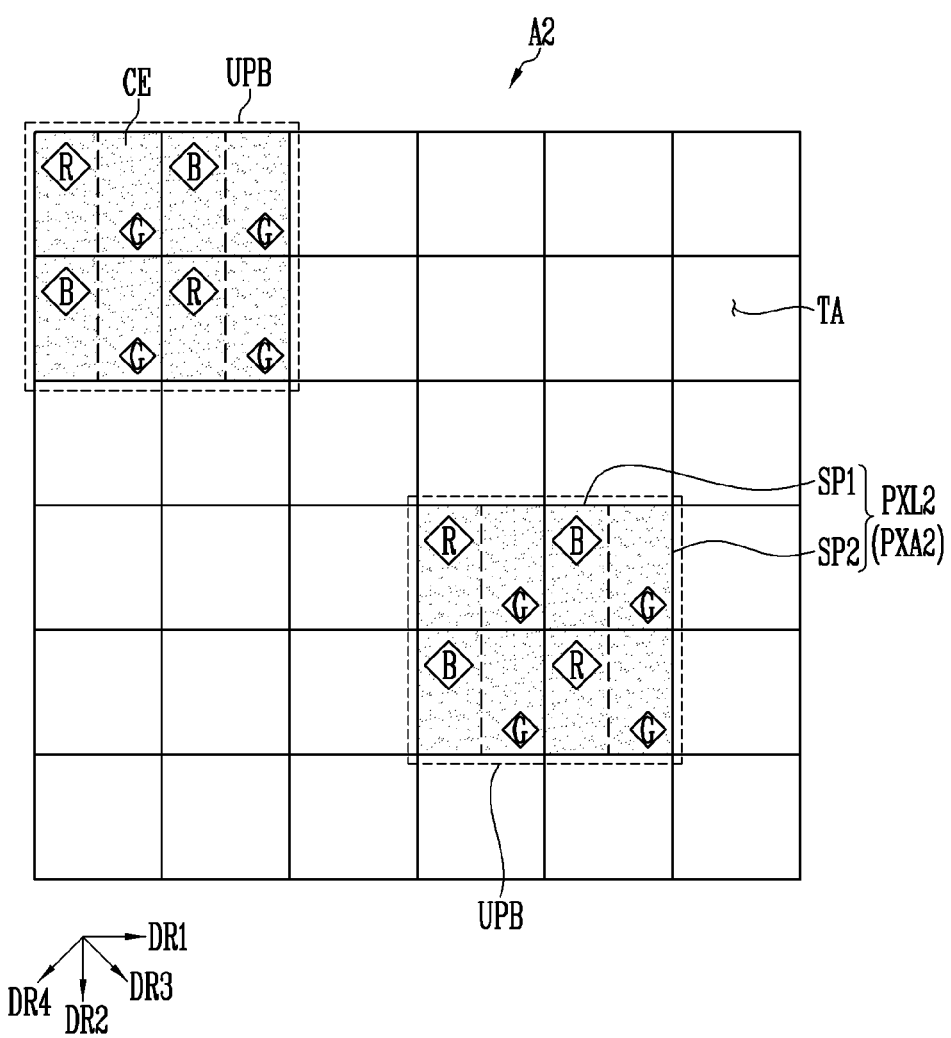
FIG. 13 is a schematic plan view illustrating an arrangement relationship between a region of second pixels and a transmissive region in one region of the second display region.

FIG. 13 is a schematic plan view illustrating an arrangement relationship between a region of second pixels and a transmissive region in one region of the second display region.

Referring to FIGS. 1A to 13, at least one region of the second display region A2 may include a plurality of second pixel regions PXA2 in which second pixels PXL2 are respectively disposed and a transmissive region TA in which the second pixels PXL2 are not disposed.

When the at least one region of the second display region A2 is configured with an array of A×B (A and B are natural numbers), an area occupied by the second pixel regions PXA and an area occupied by the transmissive region TA may be different from each other. A case where the at least one region of the second display region A2 is configured with the array of A×B may mean a matrix array in which A second pixel regions PXA2 are arranged in a first direction DR1 and B second pixel regions PXA2 are arranged in a second direction DR2. In such a case where the at least one region of the second display region A2 has a square shape, A and B may be a same value as each other.

When the at least one region of the second display region A2 is configured with an array of 6×6 as shown in FIG. 13, an area occupied by the second pixel regions PXA2 may be smaller than that occupied by the transmissive area TA. That is, in the array, a region in which the second pixels PXL2 are disposed may be smaller than that in which the second pixels PXL2 are not disposed. In an embodiment, a ratio of areas occupied by the second pixel regions PXA2 and the transmissive region TA in the array may be about 2:9.

In an embodiment, as described above, in the at least one region of the second display region A2, when unit pixel blocks UPB are disposed such that the ratio of areas occupied by the second pixel regions PXA2 and the transmissive region TA in the array becomes about 2:9, at least one region of the transmissive region TA, which are surrounded between the unit pixel blocks UPB, may constitute a transmissive window which has a shape substantially close to a circular shape or has a circular shape. A diffraction phenomenon of light penetrating (or passing through) the transmissive window is reduced, so that a larger amount of light may be effectively introduced (or incident) to the sensor SR overlapping the second display region A2.

Figure 14:
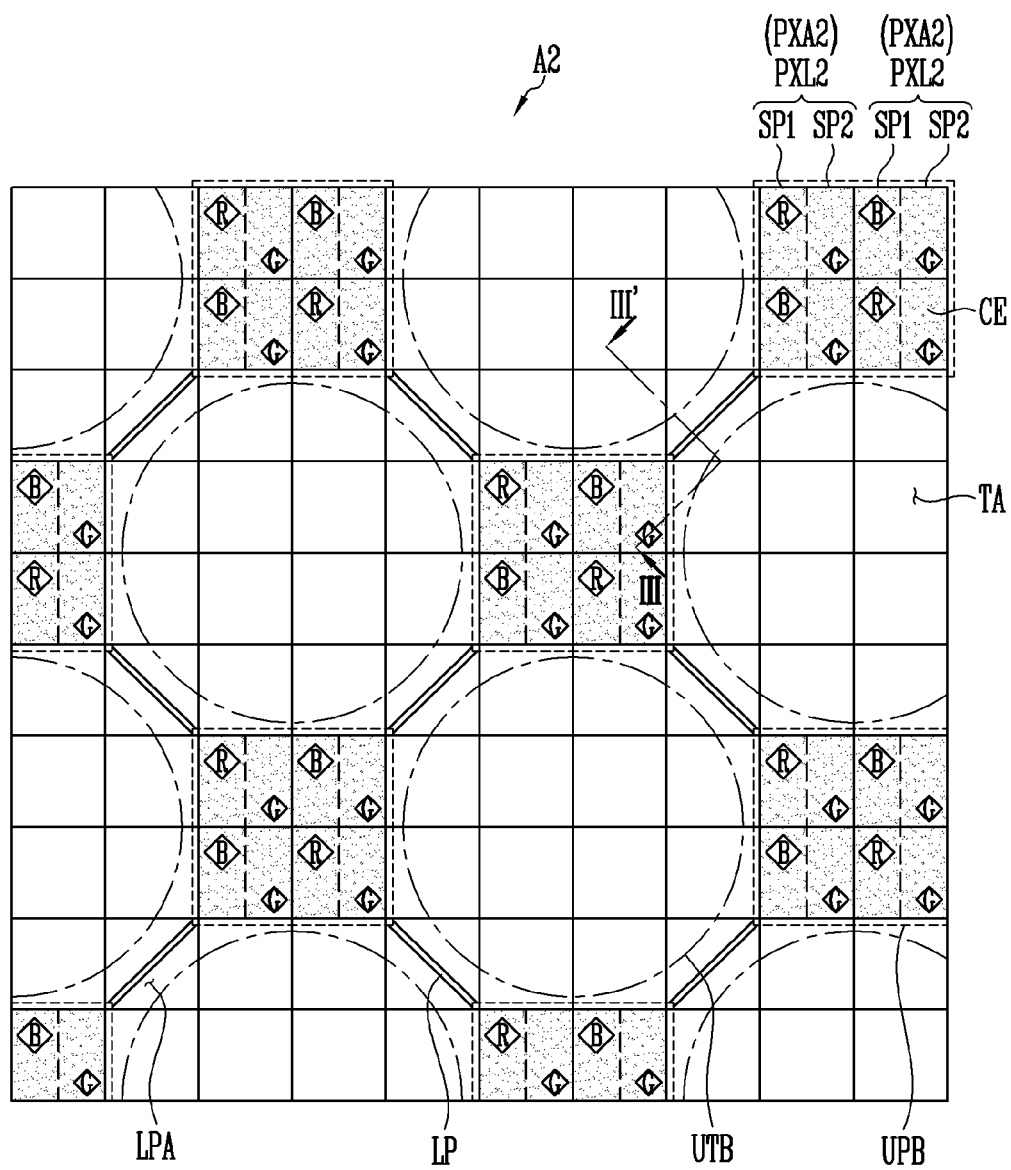
FIG. 14 is a plan view schematically illustrating a second region in accordance with an embodiment of the disclosure.
Figure 15:
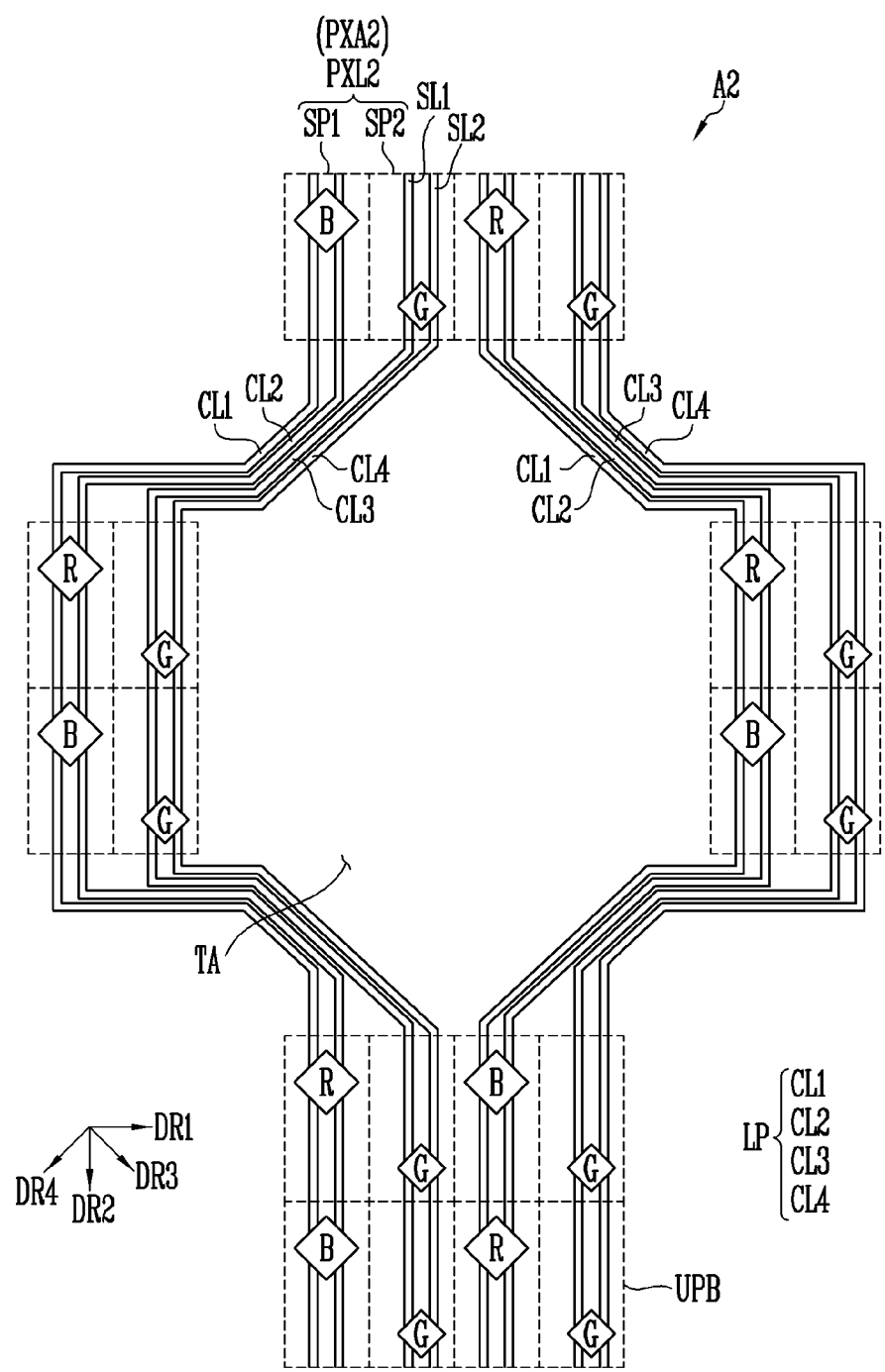
FIG. 15 is a plan view schematically illustrating a line part connecting adjacent unit pixel blocks in the second display region shown in FIG. 14.
Figure 16:
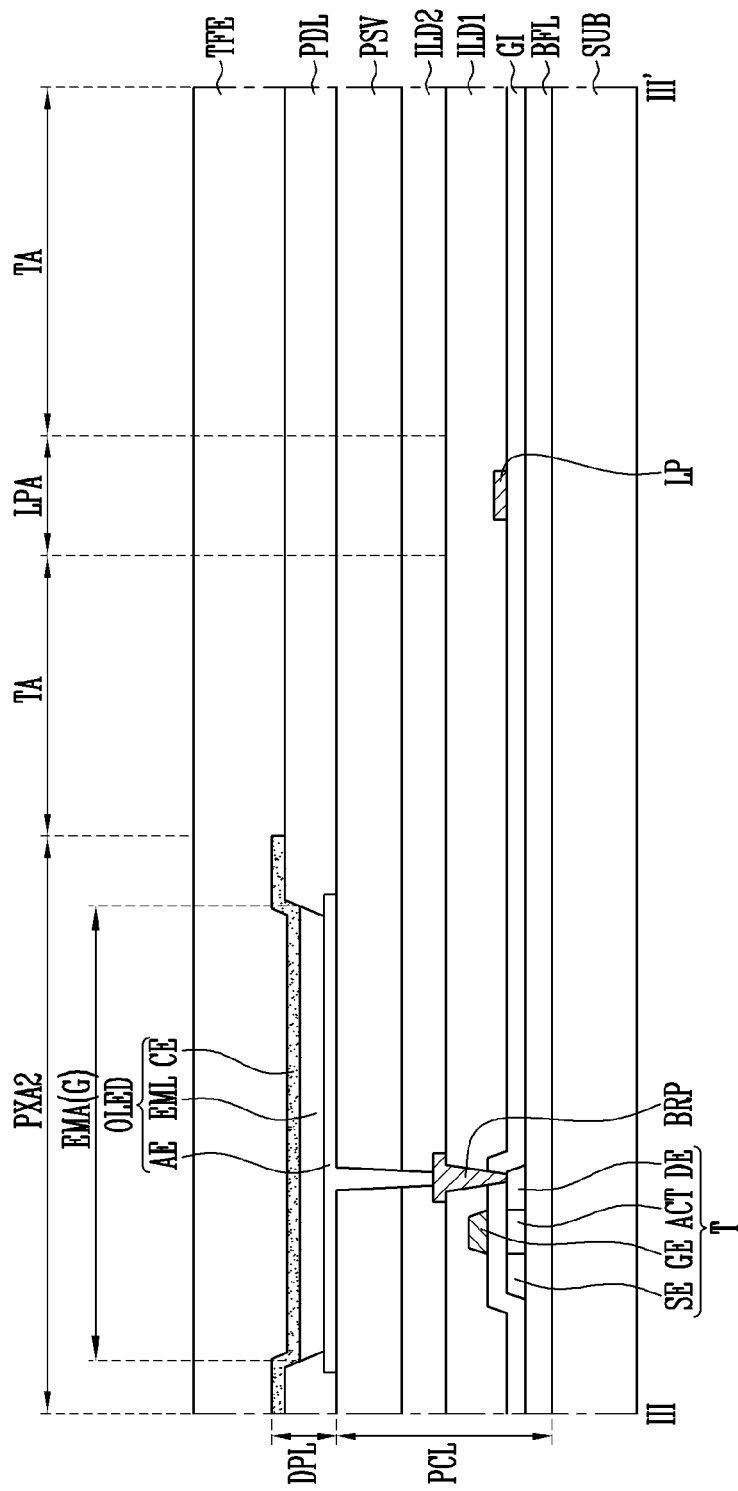
FIG. 16 is a sectional view taken along line III-III' shown in FIG. 14.
Figure 17A:
FIG. 17A illustrates an example of an image acquired by receiving light incident through a unit transmission block when the unit transmission block has a polygonal shape.
Figure 17B:
FIG. 17B illustrates an example of an image acquired by receiving light incident through a unit transmission block when the unit transmission block has a circular shape.

FIG. 14 is a plan view schematically illustrating a second region in accordance with an embodiment of the disclosure. FIG. 15 is a plan view schematically illustrating a line part connecting adjacent unit pixel blocks in the second display region shown in FIG. 14. FIG. 16 is a sectional view taken along line III-III' shown in FIG. 14. FIG. 17A illustrates an example of an image acquired by receiving light incident through a unit transmission block when the unit transmission block has a polygonal shape, and FIG. 17B illustrates an example of an image acquired by receiving light incident through a unit transmission block when the unit transmission block has a circular shape.

Referring to FIGS. 1A to 17B, at least one region of the second display region A1 may include a plurality of unit pixel blocks UPB and a transmissive region TA.

Signal lines SL1 and SL2 may be disposed in each unit pixel block UPB. The signal lines SL1 and SL2 may be commonly provided to two second pixels PXL2 located in the same row or the same column among four second pixels PXL2 included in each unit pixel block UPB. In an embodiment of the disclosure, the signal lines SL1 and SL2 may include a scan line (see Si−1, Si, and Si+1, which are shown in FIG. 5), an emission control line (see Ei shown in FIG. 5), a data line (see Dj shown in FIG. 5), an initialization power line (see IPL shown in FIG. 5), a power line (see PL shown in FIG. 5), and the like.

The signal lines SL1 and SL2 included in each unit pixel block UPB may be connected to signal lines SL1 and SL2 included in a unit pixel block UPB adjacent to the unit pixel block UPB in a third direction DR3 through a line part LP, or be connected to signal lines SL1 and SL2 included in a unit pixel block UPB adjacent to the unit pixel block UPB in a fourth direction DR4 through the line part LP.

The line part LP may include a plurality of conductive lines extending along the third direction DR3 and/or the fourth direction DR4 to connect two unit pixel blocks UPB adjacent to each other in the third direction DR3 or the fourth direction DR4. In an embodiment, the line part LP may include first to fourth conductive lines CL1 to CL4. The first to fourth conductive lines CL1 to CL4 may connect signal lines SL1 and SL2 provided in each unit pixel block UPB to signal lines SL1 and SL2 provided to a unit pixel block UPB adjacent to the unit pixel block UPB in the third direction DR3. In such an embodiment, the first to fourth conductive lines CL1 to CL4 may connect signal lines SL1 and SL2 provided in each unit pixel block UPB to signal lines SL1 and SL2 provided in a unit pixel block UPB adjacent to the unit pixel block UBP in the fourth direction DR4.

The line part LP including the first to fourth conductive lines CL1 to CL4 may be disposed while detouring along an oblique direction, e.g., the third direction DR3 and/or the fourth direction DR4 when viewed in a plane to minimize loss of light penetrating (or passing through) the transmissive region TA in the second display region A2.

In an embodiment of the disclosure, the line part LP including the first to fourth conductive lines CL1 to CL4 may be provided and/or disposed on one insulating layers among insulating layers sequentially stacked on a substrate SUB. In an embodiment, the line part LP may be provided and/or formed on a gate insulating layer GI as shown in FIG. 16, but the disclosure is not limited thereto. In an alternative embodiment, the line part LP may be disposed and/or formed between the substrate SUB and a buffer layer BFL. The conductive lines CL1 to CL4 included in the line part LP may be disposed in the same insulating layer or in different insulating layers among the insulating layers sequentially stacked on the substrate SUB in a range in which the conductive lines CL1 to CL4 are electrically insulated from each other. The first to fourth conductive lines CL1 to CL4 may be integrally provided formed with signal lines SL1 and SL2 provided in each unit pixel block UPB as a single unitary unit to be connected to the signal lines SL1 and SL2. Alternatively the first to fourth conductive lines CL1 to CL4 may be separately provided with signal lines SL1 and SL2 provided in each unit pixel block UPB to be connected to the signal lines SL1 and SL2 through a separate connection means.

In an embodiment of the disclosure, a region in which the line part LP is disposed in the at least one region of the second display region A2 may be defined as a line connection region LPA. The line connection region LPA may be one region of the transmissive region TA in which the second pixels PXL2 are not disposed. The first to fourth conductive lines CL1 to CL4 included in the line part LP may be made of a transparent metal, to minimize loss of light penetrating (or passing through) the transmissive region TA.

In an embodiment of the disclosure, the transmissive region TA may include at least one unit transmissive block UTB surrounded by the unit pixel blocks UPB and the line part LP. The unit transmissive block UTB is one region of the transmissive region TA, and may be a virtual transmissive window which has a shape substantially close to a circular shape or has a circular shape.

In such an embodiment, as described above, a distance (hereinafter, referred to as a 'first distance') between two unit pixel blocks UPB located in the same unit pixel block row in a first direction DR1 is equal to that between two unit pixel blocks UPB located in the same unit pixel block column in a second direction DR2 while being greater than that between two unit pixel blocks UPB adjacent to each other in the third direction DR3 and/or the fourth direction DR4, and the line part LP connecting adjacent unit pixel blocks UPB is disposed in an oblique direction (e.g., the third direction DR3 and/or the fourth direction DR4, the transmissive region TA may have a plurality of unit transmissive blocks UTB which have a shape substantially close to a circular shape or have a circular shape. In an embodiment, a size (or area) of the unit transmissive block UTB may be increased when a ratio of areas occupied by the region in which the second pixels PXL2 are disposed and the region, e.g., the transmissive region TA in which the second pixels PXL2 are not disposed in the at least one region of the second display region A2 is about 2:9.

Light penetrating (or passing through) unit transmissive blocks UTB which have a shape substantially close to a circular shape or a circular shape and have an increased size (or area) has a minimized diffraction phenomenon (e.g., a phenomenon in which light or beam is curved or spread at a corner), so that light loss may be reduced as compared with light penetrating (or passing through) a transmissive region having a polygonal shape. Accordingly, an amount (or intensity) of light introduced (or incident) to the sensor SR overlapping with the second display region A2 may increase. In an embodiment, where the sensor SR is a camera including an image sensor, a large amount of light is introduced to the sensor SR, so that the quality of an image acquired in the sensor SR may be improved. As a result, the sensing capability (e.g., sensing accuracy, or recognition rate) of the sensor SR overlapping with the second display region A2 may be improved.

In an embodiment, as can be seen in FIGS. 17A and 17B, quality of an image acquired by allowing light penetrating (or passing through a transmissive region having a polygonal shape to be introduced to the sensor SR may be deteriorated as compared with quality of an image acquired by allowing light penetrating (or passing through) the transmissive region having a shape substantially close to a circular shape or a circular shape.

In an embodiment, as described above, when the second pixels PXL2 are disposed in the second display region A2 such that at least one region of the transmissive region TA has a shape substantially close to a circular shape or a circular shape, a large amount of light is introduced to the sensor SR, so that the sensing capability of the sensor SR may be improved.

Figure 18:
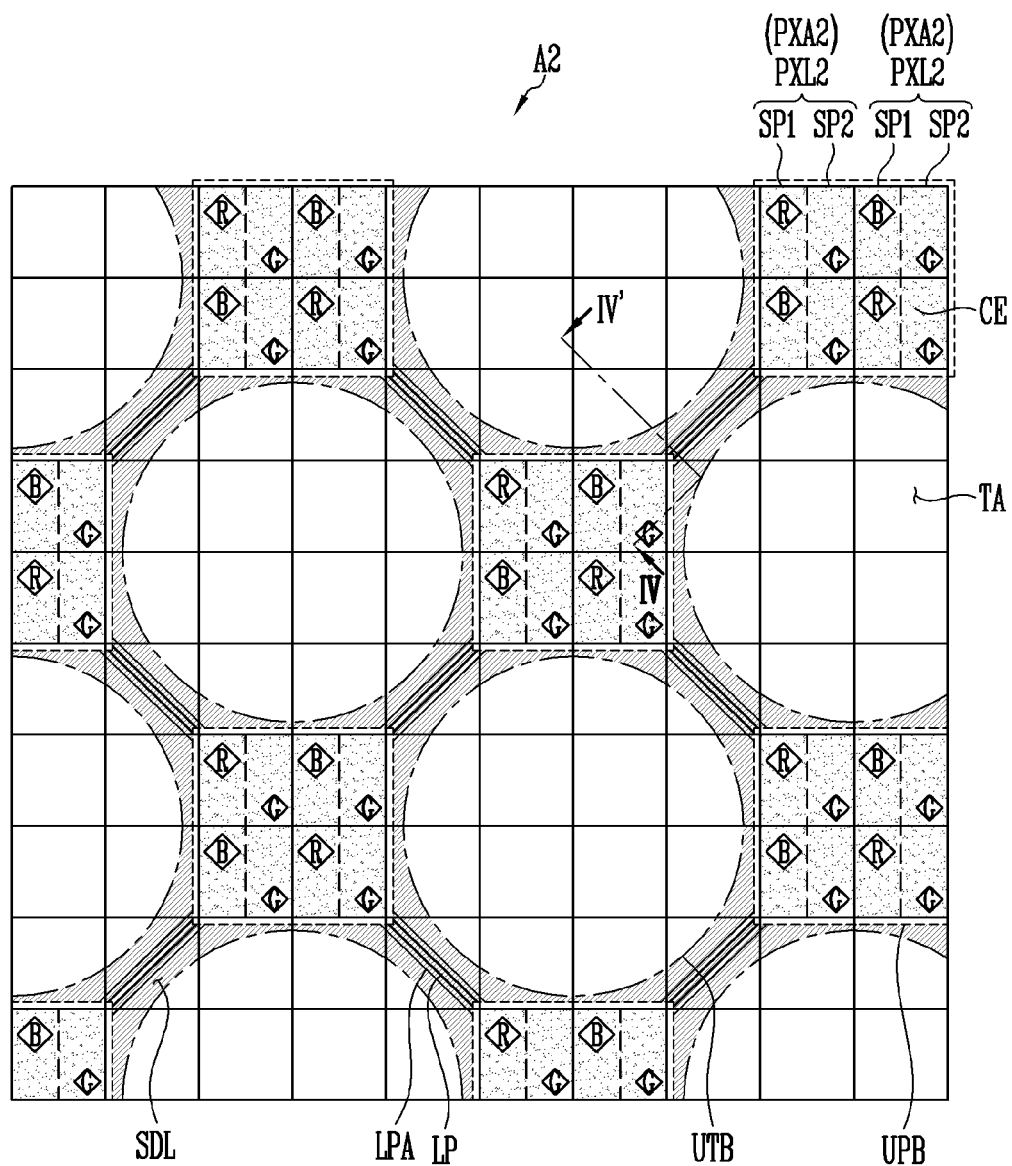
FIG. 18 is a plan view schematically illustrating a second display region in accordance with an embodiment of the disclosure.
Figure 19A:
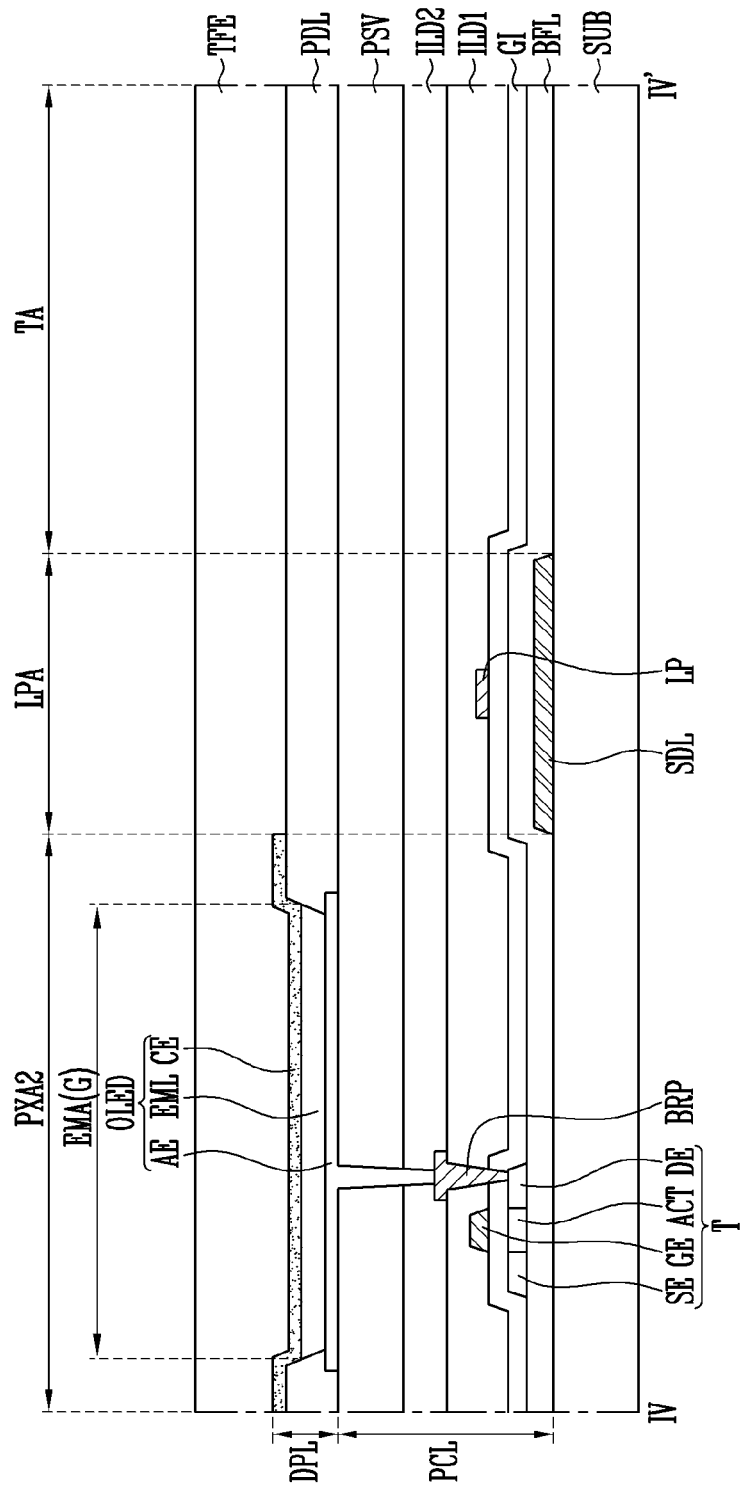
FIG. 19A is a sectional view taken along line IV-IV' shown in FIG. 18.
Figure 19B:
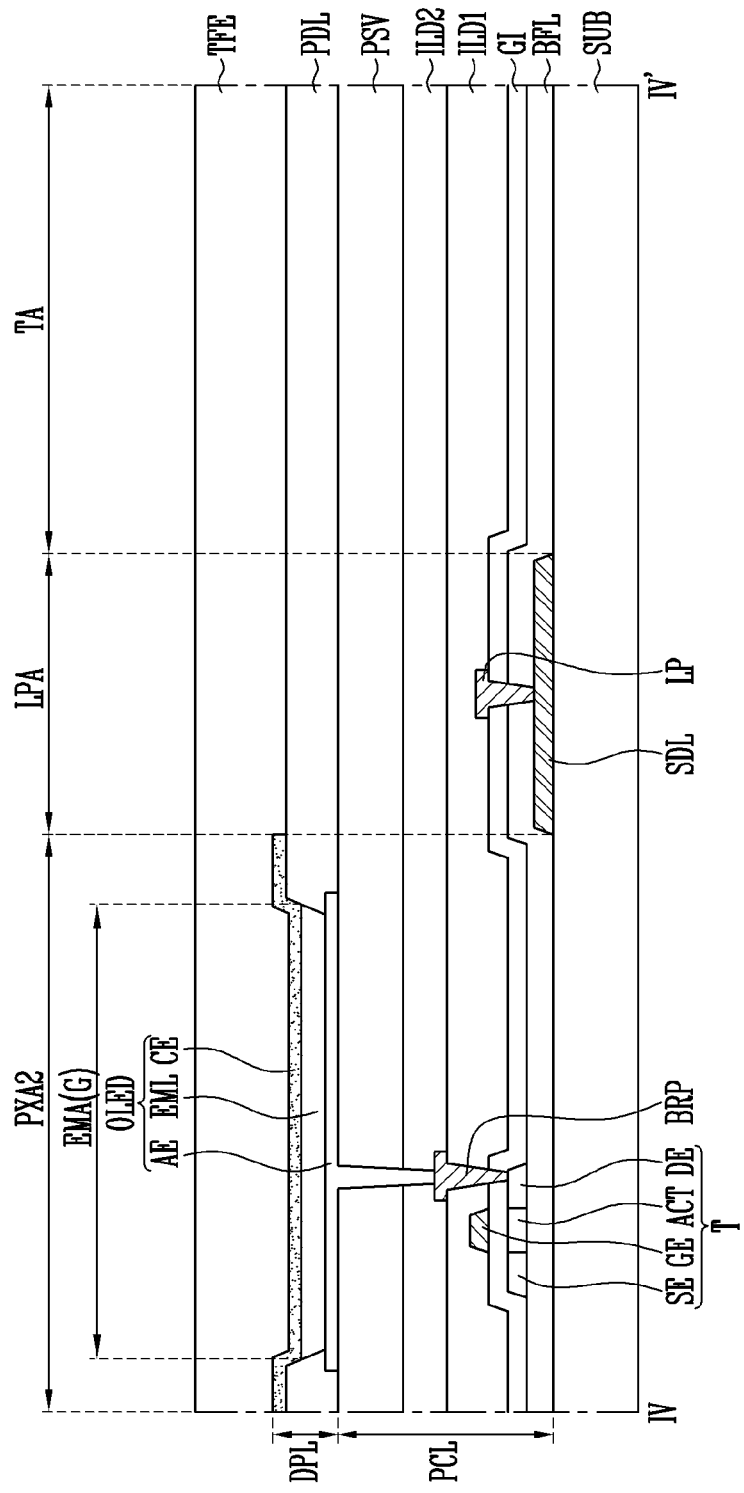
FIG. 19B illustrates an alternative embodiment of a line part shown in FIG. 18, and is a sectional view corresponding to the line IV-IV' shown in FIG. 18.

FIG. 18 is a plan view schematically illustrating a second display region in accordance with an embodiment of the disclosure. FIG. 19A is a sectional view taken along line IV-IV' shown in FIG. 18. FIG. 19B is a sectional view illustrating an alternative embodiment of a line part corresponding to the line IV-IV' shown in FIG. 18.

Hereinafter, for convenience of description, features of the second display region shown in FIGS. 18, 19A, and 19B different from those of the embodiments described above will be mainly described to avoid redundancy. Features of the second display region shown in FIGS. 18, 19A, and 19B that are not particularly described hereinafter are the same as those of the embodiments described above. In addition, identical reference numerals refer to identical components, and similar reference numerals refer to similar components.

Referring to FIGS. 1A to 13 and 18 to 19B, in an embodiment, at least one region of the second display region A2 may include a plurality of unit pixel blocks UPB and a transmissive region TA. In such an embodiment, the at least one region of the second display region A2 may include a line connection region LPA in which a line part LP connecting unit pixel blocks UPB adjacent to each other in a third direction DR3 and/or a fourth direction DR4 is disposed.

In an embodiment of the disclosure, a light blocking pattern SDL may be disposed or provided in the at least one region of the second display region A2. The light blocking pattern SDL may be disposed in a region except the unit pixel blocks UPB and unit transmissive blocks UTB. The light blocking pattern SDL may overlap the light part LP located in the line connection region LPA.

The light shielding pattern SDL may be disposed between a substrate SUB and a buffer layer BFL. The light blocking pattern SDL may include a light absorbing material or a light blocking material to absorb and/or block light introduced from the outside. In an embodiment, the light blocking pattern SDL may include or be made of a light blocking material and/or a light absorbing material. In an embodiment, the light blocking pattern SDL may include or be made of an opaque metal such as chromium (Cr), molybdenum (Mo), an alloy (MoTi) of molybdenum and titanium, tungsten (W), vanadium (V), niobium (Nb), tantalum (Ta), manganese (Mn), cobalt (Co) or nickel (Ni), which has high light absorptivity. The light blocking pattern SDL may include or be made of a single metal, or two or more kinds of metals, an alloy of two or more kinds of metals, or the like. However, the disclosure is not limited thereto. In an alternative embodiment, the light block pattern SDL may include a carbon-based black pigment.

The light blocking pattern SDL may be disposed between the substrate SUB and the buffer layer BFL, and overlap the line part LP. The light blocking pattern SDL may be disposed not to overlap a region in which each unit pixel block UPB is disposed. The light blocking pattern SDL may allow light to be concentrated on only the unit transmissive blocks UTB in which the second pixels PXL2 and the line part LP are not disposed by blocking light from being introduced to the region except the unit pixel blocks UPB and the unit transmissive blocks UTB in the second display region A2, e.g., the line connection region LPA in which the line part LP is located. That is, the light blocking pattern SDL may minimize distortion of light introduced to the sensor SR overlapping with the second display region A2 by removing a component which interferes with advancement of light between the sensor SR and the transmissive region TA.

In an embodiment where the light blocking pattern SDL includes or is made of an opaque metal, the light blocking pattern SDL may be electrically connected to the line part LP. In an embodiment, as shown in FIG. 19B, the light blocking pattern SDL may be electrically and/or physically connected to the line part LP disposed on a gate insulating layer GI through a contact hole defined through the gate insulating layer GI and the buffer layer BFL. The line part LP is in a double layer structure for minimizing line resistance, to reduce distortion of a signal applied to the line part LP.

Figure 20:
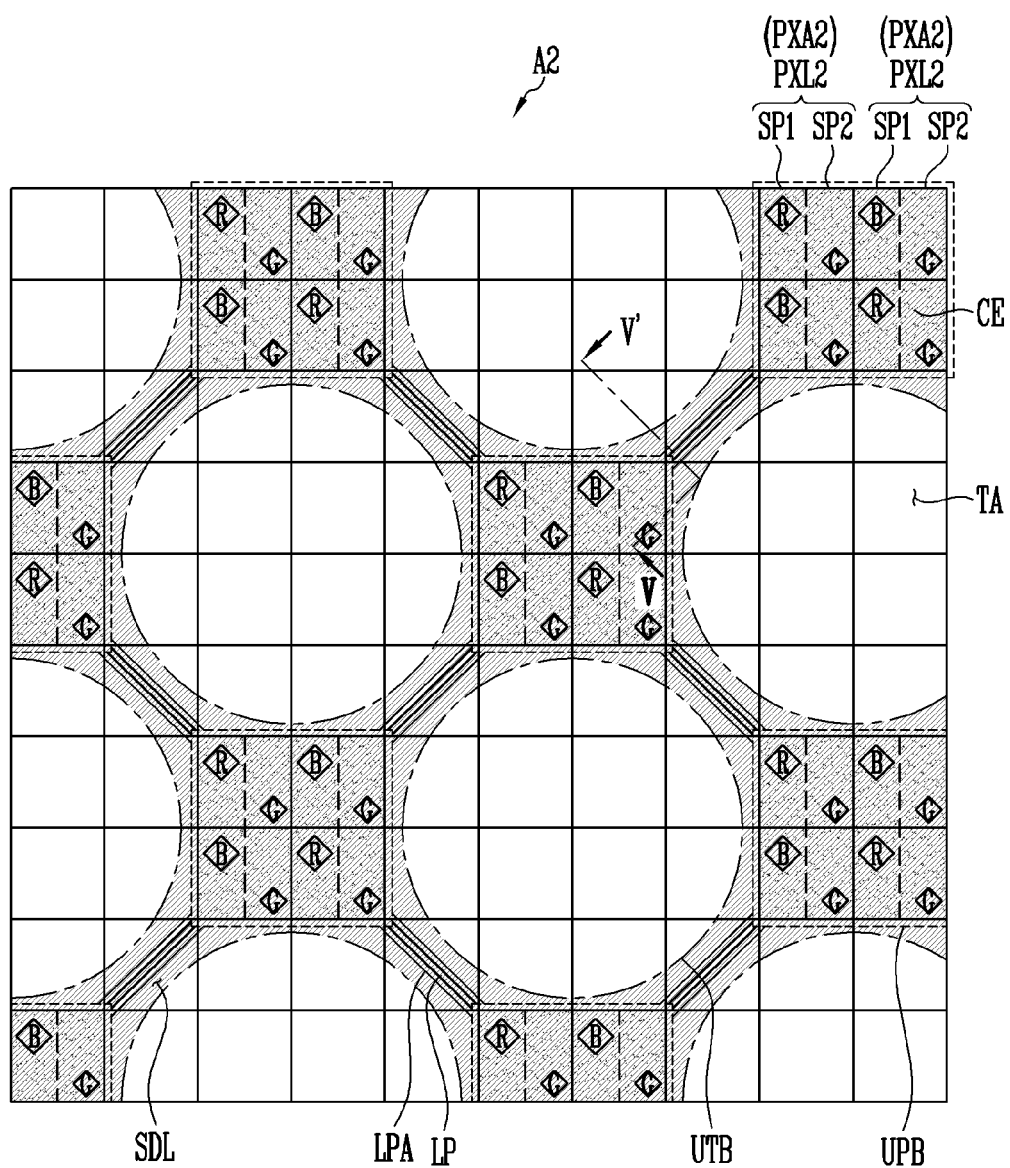
FIG. 20 is a plan view schematically illustrating a second display region in accordance with an embodiment of the disclosure.
Figure 20:
Figure 21:
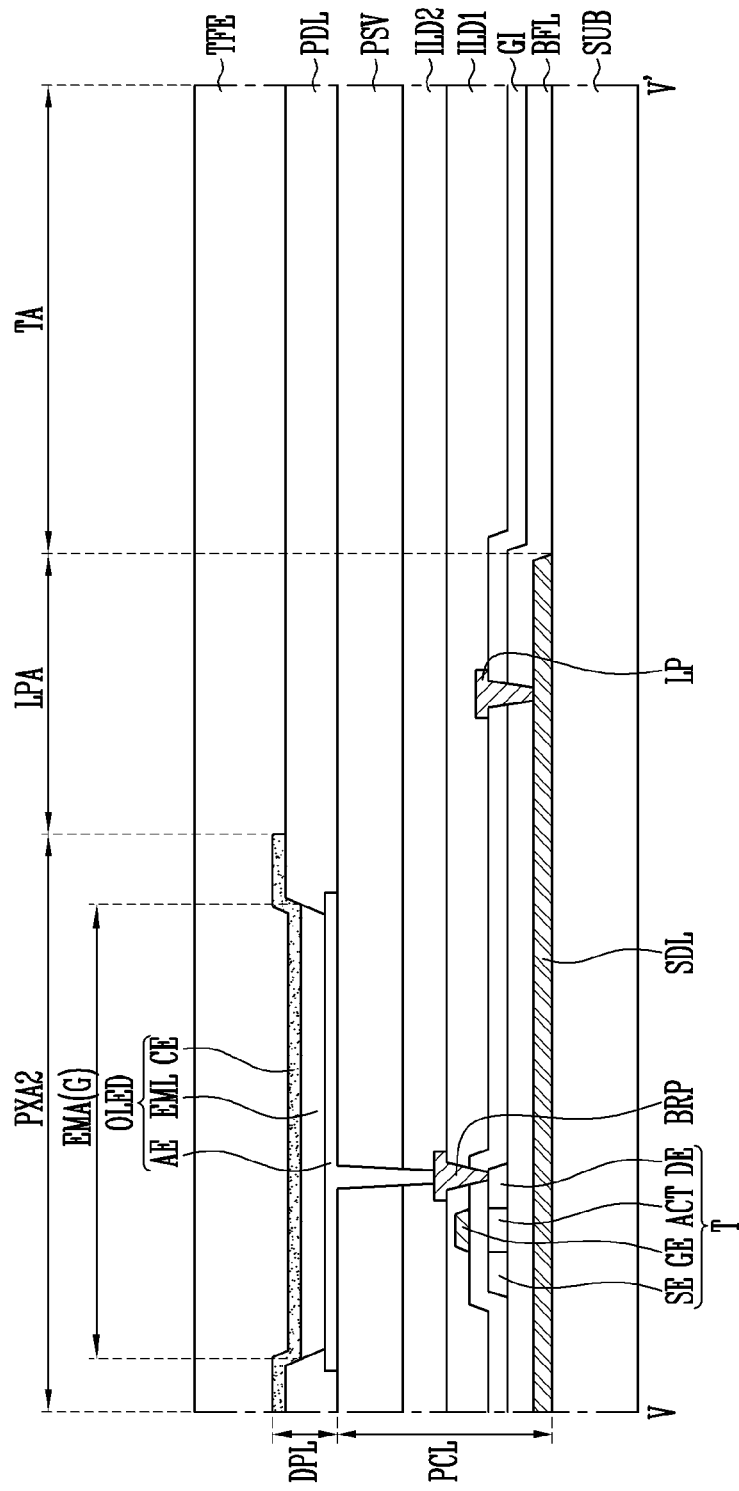
FIG. 21 is a sectional view taken along line V-V' shown in FIG. 20.

FIG. 20 is a plan view schematically illustrating a second display region in accordance with an embodiment of the disclosure. FIG. 21 is a sectional view taken along line V-V' shown in FIG. 20.

Hereinafter, for convenience of description, features of the second display region shown in FIGS. 20 and 21 different from those of the embodiments described above will be mainly described to avoid redundancy. Features of the second display region shown in FIGS. 20 and 21 that are not particularly described hereinafter are the same as those of the embodiments described above. In addition, identical reference numerals refer to identical components, and similar reference numerals refer to similar components.

Referring to FIGS. 1A to 13, 20, and 21, in an embodiment, at least one region of the second display region A2 may include a plurality of unit pixel blocks UPB and a transmissive region TA. In such an embodiment, the at least one region of the second display region A2 may include a line connection region LPA in which a line part LP connecting unit pixel blocks UPB adjacent to each other in a third direction DR3 and/or a fourth direction DR4 is disposed.

In an embodiment of the disclosure, a light blocking pattern SDL may be disposed or provided in the at least one region of the second display region A2. The light blocking pattern SDL may be provided in a region except unit transmissive blocks UTB in the at least one region of the second display region A2.

The light blocking pattern SDL may be located between a substrate SUB and the line part LP, and block light introduced to the line part LP. In such an embodiment, the light blocking pattern SDL may be located between each unit pixel block UPB and the substrate SUB, and block light introduced to the unit pixel block UPB.

The light blocking pattern SDL may include or be made of a light blocking material and/or a light absorbing material, and include an opaque metal or a carbon-based black pigment.

The light blocking pattern SDL may allow light to be concentrated on the transmissive region in which the second pixels PXL2 and the line part LP are not disposed by blocking light from being introduced to the line connection region LPA.

In such an embodiment, the light blocking pattern SDL may block light from being introduced to a fine opening region caused by a gap between components provided in each second pixel PXL2 of each unit pixel block UPB, e.g., components included in a pixel circuit layer PCL and components included in a display element layer DPL. That is, the light blocking pattern SDL may allow light to be further concentrated on only the transmissive region TA in which the second pixels PXL2 and the line part LP are not disposed by blocking light from being introduced to the fine opening region included in each unit pixel block UPB.

In an embodiment of the disclosure, the light blocking pattern SDL may minimize distortion of light introduced to the sensor SR overlapping the second display region A2 by removing a component which interferes with advancement of light between the sensor SR and the transmissive region TA.

In accordance with embodiments of the disclosure, a display device allows a sensor disposed therebelow to capture an image with improved quality by effectively ensuring light incident into the sensor overlapping with at least one of first and second display regions.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device, comprising:
    a substrate including a first display region and a second display region, the second display region including a transmissive region through which light is transmitted;
    unit pixel blocks disposed in the first display region and the second display region; and
    a light blocking pattern disposed on the substrate in at least one region of the second display region,
    wherein:
    each of the unit pixel blocks in the second display region includes a plurality of sub-pixels emitting light of different colors each other,
    four adjacent unit pixel blocks among the unit pixel blocks in the second display region include a first unit pixel block and a second unit pixel block adjacent to each other in a first direction and a third unit pixel block and a fourth unit pixel block adjacent to each other in a second direction,
    each of the third and fourth unit pixel blocks is adjacent to one of the first pixel and the second pixel in an oblique direction inclined to the first direction,
    an opening is defined through the light blocking pattern in an area surrounded by the first to fourth unit pixel blocks, the opening is entirely enclosed by the light blocking pattern in a plan view, and the opening entirely enclosed by the light blocking pattern has a round shape.

2. The display device of claim 1, wherein
each of the plurality of sub-pixels includes a pixel circuit layer disposed on the substrate and a display element layer disposed on the pixel circuit layer.

3. The display device of claim 1, wherein
the light blocking pattern entirely overlaps the unit pixel blocks in the second display region.

4. The display device of claim 3, wherein
each of the plurality of the sub-pixels includes a transistor disposed on the substrate,
the transistor includes:
an active pattern;
a gate electrode disposed on the active pattern; and
source and drain electrodes, each connected to the active pattern.

5. The display device of claim 4, wherein
the light blocking pattern is disposed between the substrate and the active pattern.

6. The display device of claim 1, further comprising:
a line part disposed on the substrate and electrically connected to at least one of the plurality of sub-pixels,
wherein the line part includes a first portion extending in the oblique direction between the first unit pixel block and one of the third unit pixel block and the fourth unit pixel block and a second portion extending in the oblique direction between the second unit pixel block and one of the third unit pixel block and the fourth unit pixel block.

7. The display device of claim 6, wherein
the line part includes at least one of a scan line, a data line, an emission control line, an initialization power line, and a power line,
the scan line is configured to receive a scan signal,
the data line is configured to receive a data signal,
the emission control line is configured to receive an emission control signal,
the initialization power line is configured to receive a voltage of an initialization power source, and
the power line is configured to receive a voltage of a first power source.

8. The display device of claim 6, wherein
the light blocking pattern overlaps at least one of the first and second portions of the line part.

9. The display device of claim 8, wherein
the light blocking pattern entirely overlaps the first and second portions of the line part.

10. The display device of claim 6, wherein
the light blocking pattern includes an opaque conductive material.

11. The display device of claim 10, wherein
the light blocking pattern is electrically connected to the line part.

12. The display device of claim 1, wherein
the transmissive region includes at least one insulating layer disposed on the substrate,
the at least one insulating layer includes an inorganic layer having a first opening part, and
the inorganic layer overlaps the light blocking pattern.

13. The display device of claim 12, wherein
the at least one insulating layer further includes an organic layer having a second opening part overlapping the first opening part of the inorganic layer.

14. The display device of claim 12, wherein
the line part does not overlap the plurality of unit transmissive blocks.

15. The display device of claim 1, wherein
a cathode electrode of the each of the unit pixel blocks in the second display region is not disposed in at least one region of the transmissive region.

16. The display device of claim 1, wherein
the unit pixel blocks of the second display region are not disposed in the transmissive region.

17. The display device of claim 1, wherein
a density of the unit pixel blocks in the first display region is higher than a density of the unit pixel blocks in the second display region.

18. The display device of claim 1, wherein
the second display region has a size smaller than a size of the first display region, and is connected to the first display region.

19. The display device of claim 1, further comprising:
a sensor overlapping the second display region,
wherein the second display region is disposed to overlap at least a portion of the sensor to allow light to pass therethrough to the sensor.

20. The display device of claim 1, wherein the light blocking pattern includes a light absorbing material.

* * * * *